(12) United States Patent
Uzoh et al.

(10) Patent No.: US 9,455,237 B2
(45) Date of Patent: Sep. 27, 2016

(54) BOWL-SHAPED SOLDER STRUCTURE

(71) Applicant: Invensas Corporation, San Jose, CA (US)

(72) Inventors: Cyprian Emeka Uzoh, San Jose, CA (US); Rajesh Katkar, San Jose, CA (US)

(73) Assignee: Invensas Corporation, San Jose, CA (US)

(*) Notice: Subject to any disclaimer, the term of this patent is extended or adjusted under 35 U.S.C. 154(b) by 0 days.

(21) Appl. No.: 14/754,293

(22) Filed: Jun. 29, 2015

(65) Prior Publication Data

US 2015/0303157 A1    Oct. 22, 2015

Related U.S. Application Data

(62) Division of application No. 14/050,193, filed on Oct. 9, 2013, now Pat. No. 9,070,676.

(51) Int. Cl.
*H01L 21/44* (2006.01)
*H01L 23/00* (2006.01)
(Continued)

(52) U.S. Cl.
CPC ........... *H01L 24/11* (2013.01); *H01L 21/3213* (2013.01); *H01L 21/32139* (2013.01); *H01L 21/4853* (2013.01); *H01L 21/76885* (2013.01); *H01L 23/49811* (2013.01); *H01L 24/03* (2013.01); *H01L 24/05* (2013.01); *H01L 24/13* (2013.01); *H01L 2224/02166* (2013.01); *H01L 2224/0348* (2013.01); *H01L 2224/0362* (2013.01); *H01L 2224/03462* (2013.01); *H01L 2224/03823* (2013.01); *H01L 2224/0401* (2013.01); *H01L 2224/05023* (2013.01); *H01L 2224/0569* (2013.01); *H01L 2224/05082* (2013.01); *H01L 2224/05147* (2013.01); (Continued)

(58) Field of Classification Search
CPC ............... H01L 24/11; H01L 21/3213; H01L 21/32139; H01L 2224/11464
USPC ........................................................ 438/614
See application file for complete search history.

(56) References Cited

U.S. PATENT DOCUMENTS 6,624,512 B2   9/2003   Kurusu
6,930,032 B2   8/2005   Sarihan et al.
(Continued)

FOREIGN PATENT DOCUMENTS

| JP | 10-163267 | 6/1998 |
| WO | 03-060960 | 7/2003 |
| WO | 2010-046235 | 4/2010 |

OTHER PUBLICATIONS

International Search Report and Written Opinion for Application No. PCT/US2014/059737 dated Feb. 6, 2015.

*Primary Examiner* — David S Blum

(57) ABSTRACT

An apparatus relating generally to a substrate is disclosed. In this apparatus, a first metal layer is on the substrate. The first metal layer has an opening. The opening of the first metal layer has a bottom and one or more sides extending from the bottom. A second metal layer is on the first metal layer. The first metal layer and the second metal layer provide a bowl-shaped structure. An inner surface of the bowl-shaped structure is defined responsive to the opening of the first metal layer and the second metal layer thereon. The opening of the bowl-shaped structure is configured to receive and at least partially retain a bonding material during a reflow process.

19 Claims, 22 Drawing Sheets

(51) Int. Cl.
*H01L 23/498* (2006.01)
*H01L 21/768* (2006.01)
*H01L 21/48* (2006.01)
*H01L 21/3213* (2006.01)

(52) U.S. Cl.
CPC ............ *H01L2224/05164* (2013.01); *H01L 2224/05554* (2013.01); *H01L 2224/05556* (2013.01); *H01L 2224/05558* (2013.01); *H01L 2224/05564* (2013.01); *H01L 2224/05565* (2013.01); *H01L 2224/05568* (2013.01); *H01L 2224/05578* (2013.01); *H01L 2224/05582* (2013.01); *H01L 2224/05611* (2013.01); *H01L 2224/05664* (2013.01); *H01L 2224/05686* (2013.01); *H01L 2224/10126* (2013.01); *H01L 2224/10145* (2013.01); *H01L 2224/1111* (2013.01); *H01L 2224/11013* (2013.01); *H01L 2224/1182* (2013.01); *H01L 2224/11462* (2013.01); *H01L 2224/11464* (2013.01); *H01L 2224/11849* (2013.01); *H01L 2224/131* (2013.01); *H01L 2224/81815* (2013.01); *H01L 2924/15787* (2013.01); *H01L 2924/15788* (2013.01)

(56) References Cited

U.S. PATENT DOCUMENTS

| | | | |
|---|---|---|---|
| 2001/0030223 | A1 | 10/2001 | Cavallotti et al. |
| 2009/0289360 | A1 | 11/2009 | Takahashi et al. |
| 2011/0291259 | A9 * | 12/2011 | Huang .............. H01L 24/03 257/737 |
| 2013/0241071 | A1 | 9/2013 | Hsieh |

* cited by examiner

BOWL-SHAPED SOLDER STRUCTURE

CROSS-REFERENCE TO RELATED APPLICATION

This application is a divisional of U.S. application Ser. No. 14/050,193, now U. S. Pat. No. 9,070,676, filed Oct. 9, 2013, the disclosure of which is incorporated herein by reference.

FIELD

The following description relates to integrated circuits ("ICs"). More particularly, the following description relates to a bowl-shaped solder structure for an IC.

BACKGROUND

Microelectronic assemblies generally include one or more ICs, such as for example one or more packaged dies ("chips") or one or more dies. One or more of such ICs may be mounted on a circuit platform, such as a wafer such as in wafer-level-packaging ("WLP"), printed board ("PB"), a printed wiring board ("PWB"), a printed circuit board ("PCB"), a printed wiring assembly ("PWA"), a printed circuit assembly ("PCA"), a package substrate, an interposer, or a chip carrier. Additionally, one IC may be mounted on another IC. An interposer may be an IC, and an interposer may be a passive or an active IC, where the latter includes one or more active devices, such as transistors for example, and the former does not include any active device. Furthermore, an interposer may be formed like a PWB, namely without any circuit elements such as capacitors, resistors, or active devices. Additionally, an interposer includes at least one through-substrate-via.

An IC may include conductive elements, such as pathways, traces, tracks, vias, contacts, pads such as contact pads and bond pads, plugs, nodes, or terminals for example, that may be used for making electrical interconnections with a circuit platform. These arrangements may facilitate electrical connections used to provide functionality of ICs. An IC may be coupled to a circuit platform by bonding, such as bonding traces or terminals, for example, of such circuit platform to bond pads or exposed ends of pins or posts or the like of an IC. Additionally, a redistribution layer ("RDL") may be part of an IC to facilitate a flip-chip configuration, die stacking, or more convenient or accessible position of bond pads for example. Conventional interconnecting of an IC to another IC or to a circuit platform has issues with solder bridging.

Accordingly, it would be desirable and useful to provide a structure for interconnection of an IC that mitigates against solder bridging.

BRIEF SUMMARY

An apparatus relates generally to a substrate. In such an apparatus, a first metal layer is on the substrate. The first metal layer has an opening. The opening of the first metal layer has a bottom and one or more sides extending from the bottom. A second metal layer is on the first metal layer. The first metal layer and the second metal layer provide a bowl-shaped structure. An inner surface of the bowl-shaped structure is defined responsive to the opening of the first metal layer and the second metal layer thereon. The opening of the bowl-shaped structure is configured to receive and at least partially retain a bonding material during a reflow process.

An apparatus relates generally to another substrate. In such an apparatus, a first metal layer and a polymer layer are on the substrate. A second metal layer is on the first metal layer, and the second metal layer extending along a portion of the polymer layer. The first metal layer, the second metal layer and the polymer layer in combination provide a bowl-shaped structure. The second metal layer provides an inner surface of the bowl-shaped structure. The polymer layer provides one or more sides of the bowl-shaped structure with the one or more sides extending from the substrate. The first metal layer is disposed between the substrate and the polymer layer providing a bottom of the bowl-shaped structure on which the second metal layer is plated. The portion of the polymer layer having the second metal layer extending along thereof is included in the one or more sides of the bowl-shaped structure. The bowl-shaped structure defines an opening. The opening of the bowl-shaped structure is configured to receive and at least partially retain a bonding material during a reflow process.

A method relates generally to forming a bowl-shaped structure. A substrate having a first metal layer and a second metal layer is obtained. The second metal layer is disposed on the first metal layer. A first mask is formed on an upper surface of the second metal layer. An opening is etched in the second metal layer responsive to an opening in the first mask. A lower surface and a sidewall surface in the opening in the second metal layer is plated with a first metal. A second metal is plated on the first metal. The first mask is removed. A second mask is formed in the opening and on a portion of the upper surface of the second metal layer surrounding the opening. The second metal layer is etched responsive to an opening in the second mask down to an etch stop layer to provide the bowl-shaped structure.

BRIEF DESCRIPTION OF THE DRAWING(S)

Accompanying drawing(s) show exemplary embodiment(s) in accordance with one or more aspects of exemplary apparatus(es) or method(s). However, the accompanying drawings should not be taken to limit the scope of the claims, but are for explanation and understanding only.

DETAILED DESCRIPTION

In the following description, numerous specific details are set forth to provide a more thorough description of the specific examples described herein. It should be apparent, however, to one skilled in the art, that one or more other examples or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Figure 1A:
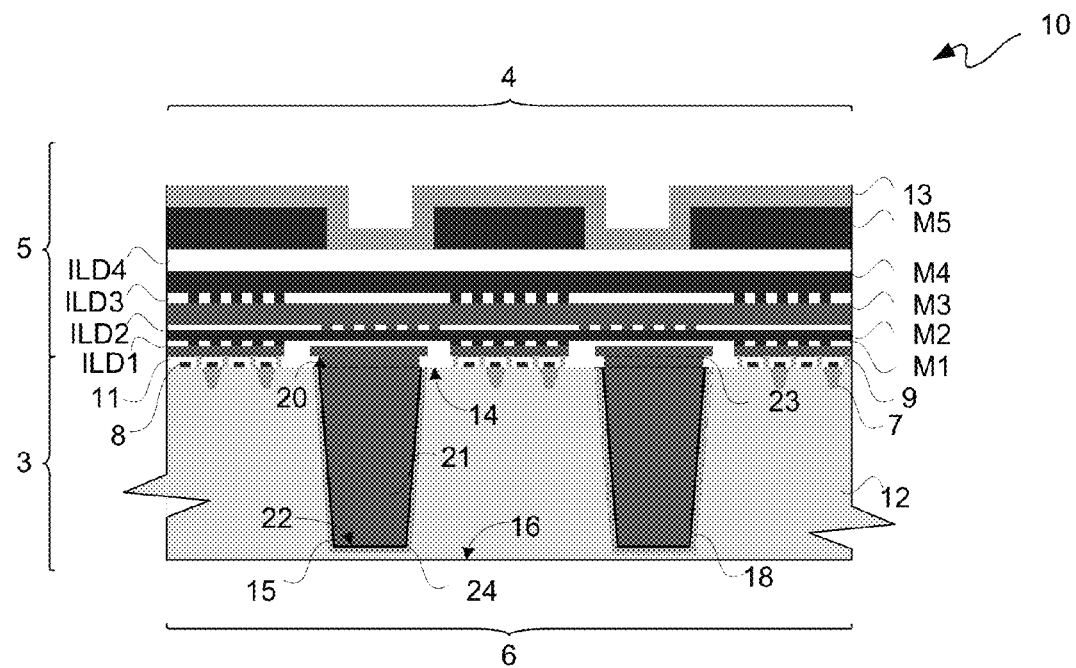
FIG. 1A is a schematic diagram of a cross-sectional view depicting an exemplary portion of an in-process wafer for providing an integrated circuit ("IC").

FIG. 1A is a schematic diagram of a cross-sectional view depicting an exemplary portion of an in-process wafer for providing an IC 10 component. IC 10 includes a substrate 12 of a semiconductor material such as silicon (Si), gallium arsenide (GaAs), polymeric, ceramic, carbon-based substrates such as diamond, a silicon carbon (SiC), germanium (Ge), $Si_{1-x}Ge_x$, or the like. Even though a semiconductor substrate 12 as provided from an in-process wafer is generally described below, any sheet or layer semiconductor material or dielectric material, such as ceramic or glass for example, may be used as a substrate. Furthermore, even though an IC 10 is described, any microelectronic component that includes one or more through-substrate via structures may be used.

Substrate 12 includes an upper surface 14 and a lower surface 16 that extend in lateral directions and are generally parallel to each other at a thickness of substrate 12. Use of terms such as "upper" and "lower" or other directional terms is made with respect to the reference frame of the figures and is not meant to be limiting with respect to potential alternative orientations, such as in further assemblies or as used in various systems.

Upper surface 14 may generally be associated with what is referred to as a "front side" 4 of an in-process wafer, and lower surface 16 may generally be associated with what is referred to as a "backside" 6 of an in-process wafer. Along those lines, a front-side 4 of an in-process wafer may be used for forming what is referred to as front-end -of-line ("FEOL") structures 3 and back-end-of-line ("BEOL") structures 5. Generally, FEOL structures 3 may include shallow trench isolations ("STI") 7, transistor gates 8, transistor source/drain regions (not shown), transistor gate dielectrics (not shown), contact etch stop layer ("CESL"; not shown), a pre-metallization dielectric or pre-metal dielectric ("PMD") 11, and contact plugs 9, among other FEOL structures. A PMD 11 may be composed of one or more layers. Generally, BEOL structures 5 may include one or more inter-level dielectrics ("ILDs") and one or more levels of metallization ("M"). In this example, there are four ILDs, namely ILD1, ILD2, ILD3, and ILD4; however, in other configurations there may be fewer or more ILDs. Furthermore, each ILD may be composed of one or more dielectric layers. In this example, there are five levels of metallization, namely M1, M2, M3, M4, and M5; however, in other configurations there may be fewer or more levels of metallization. Additionally, metal from a metallization level may extend through one or more ILDs, as is known. Furthermore, each level of metallization may be composed of one or more metal layers. A passivation level 13 may be formed on a last metallization layer. Such passivation level 13 may include one or more dielectric layers, and further may include an anti-reflective coating ("ARC"). Furthermore, a redistribution layer ("RDL") may be formed on such passivation level. Conventionally, an RDL may include: a dielectric layer, such as a polyimide layer for example; another metal layer on such dielectric layer and connected to a bond pad of a metal layer of a last metallization level; and another dielectric layer, such as another polyimide layer for example, over such RDL metal layer while leaving a portion thereof exposed to provide another bond pad. A terminal opening may expose such other bond pad of such RDL metal layer. Thereafter, a solder bump or wire bond may be conventionally coupled to such bond pad.

As part of a FEOL or BEOL structure formation, a plurality of via structures 18 may extend within openings formed in substrate 12 which extend into substrate 12. Via structures 18 may be generally in the form of any solid of any shape formed by filling an opening formed in substrate 12. Examples of such solid shapes generally include cylindrical, conical, frustoconical, rectangular prismatic, cubic, or the like. Examples of openings for via structures, vias, and processes for the fabrication thereof, may be found in U.S. patent application Ser. No. 13/193,814 filed Jul. 29, 2011, and U.S. patent application Ser. Nos. 12/842,717 and 12/842,651 both filed on Jul. 23, 2010, and each of these patent applications is hereby incorporated by reference herein for all purposes to the extent same is consistent with the description hereof.

Conventionally, via structures 18 may extend from upper surface 14 down toward lower surface 16, and after a backside reveal, via structures 18 may extend between surfaces 14 and 16, as effectively thickness of substrate 12 may be thinned so as to reveal lower end surfaces of via structures 18, as described below in additional detail. Via structures 18 extending through substrate 12 between surfaces 14 and 16, though they may extend above or below such surfaces, respectively, may be referred to as through-substrate-vias. As substrates are often formed of silicon, such through-substrate-vias are commonly referred to as TSVs, which stands for through-silicon-vias.

Such openings formed in substrate 12 may be conformally coated, oxidized, or otherwise lined with a liner or insulator 15. Conventionally, liner 15 is silicon dioxide; however, a silicon oxide, a silicon nitride, or another dielectric material may be used to electrically isolate via structures 18 from substrate 12. Generally, liner 15 is an insulating or dielectric material positioned between any and all conductive portions of a via structure 18 and substrate 12 such that an electronic signal, a ground, a supply voltage, or the like carried by such via structure 18 is not substantially leaked into substrate 12, which may cause signal loss or attenuation, shorting, or other circuit failure.

Overlying a liner 15 may be a barrier layer 24. Generally, barrier layer 24 is to provide a diffusion barrier with respect to a metallic material used to generally fill a remainder of an opening in which a via structure 18 is formed. Barrier layer 24 may be composed of one or more layers. Furthermore, a barrier layer 24 may provide a seed layer for subsequent electroplating or other deposition, and thus barrier layer 24 may be referred to as a barrier/seed layer. Moreover, barrier layer 24 may provide an adhesion layer for adherence of a subsequently deposited metal. Thus, barrier layer 24 may be a barrier/adhesion layer, a barrier/seed layer, or a barrier/adhesion/seed layer. Examples of materials that may be used for barrier layer 24 include tantalum (Ta), tantalum nitride (TaN), palladium (Pd), titanium nitride (TiN), TaSiN, compounds of Ta, compounds of Ti, compounds of Ni, compounds of Cu, among others.

Via structures 18 may generally consist of a metallic or other conductive material generally filling a remaining void in an opening formed in substrate 12 to provide a via conductor 21. In various examples, a via conductor 21 of a via structure 18 may generally consist of copper or a copper alloy. However, a via conductor 21 may additionally or alternatively include one or more other conductive materials such as tantalum, nickel, titanium, molybdenum, tungsten, aluminum, gold, or silver, including various alloys or compounds of one or more of the these materials, and the like. A via conductor 21 may include non-metallic additives to control various environmental or operational parameters of a via structure 18.

Via structures 18 may each include an upper end contact surface 20 which may be level with upper surface 14 of substrate 12 and a lower end contact surface 22 which may be level with lower surface 16 of substrate 12 after a backside reveal. End surfaces 20 and 22 may be used to interconnect via structures 18 with other internal or external components, as below described in additional detail.

In this example, upper end contact surface 20 of via conductors 21 are interconnected to M1 through a respective contact pad 23. Contact pads 23 may be formed in respective openings formed in PMD 11 in which M1 extends. However, in other configurations, one or more via conductors 21 may extend to one or more other higher levels of metallization through one or more ILDs. Furthermore, via structure 18 is what may be referred to as a front side TSV, as an opening used to form via structure is initially formed by etching from a front side of substrate 12.

Figure 1B:
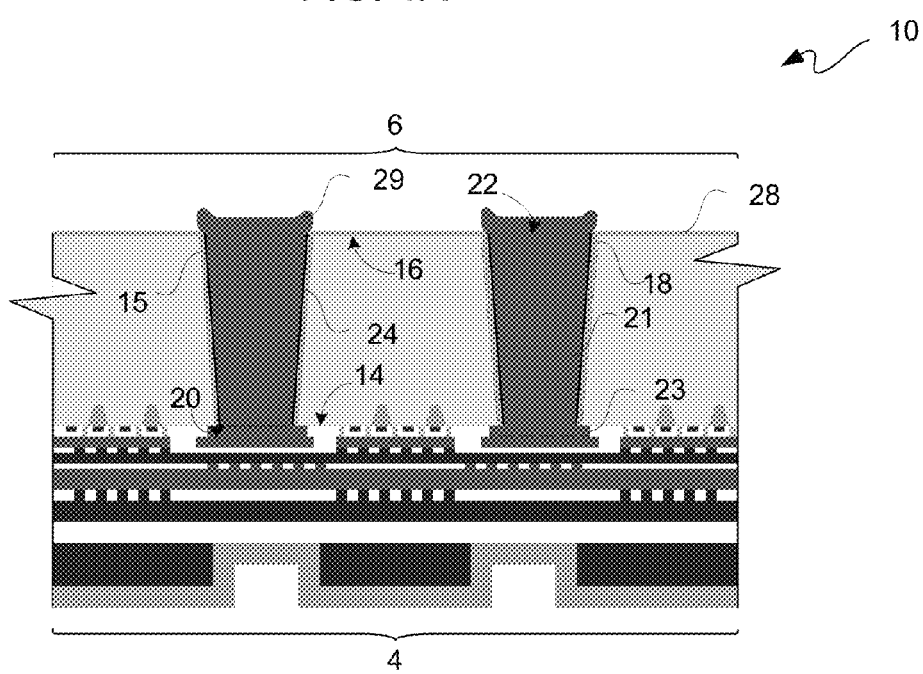
FIG. 1B is a schematic diagram of a cross-sectional view depicting an exemplary portion of an in-process wafer for providing another IC.

However, a via structure may be a backside TSV, as generally indicated in FIG. 1B, where there is shown a schematic diagram of a cross-sectional view depicting an exemplary portion of an in-process wafer for providing another IC 10. Fabrication of a backside TSV is generally referred to as a "via last approach," and accordingly fabrication of a front side TSV is generally referred to as a "via first approach."

IC 10 of FIG. 1B includes a plurality of via structures 18, which are backside TSVs. For a backside TSV for via structure 18, liner 15 may be a deposited polymer into a "donut" silicon trench etch and deposited on lower surface 16 as a passivation layer 28, followed by a central silicon trench etch to remove an inner portion of the "donut" silicon trench, and followed by a seed layer deposition before patterning and electroplating to provide via conductors 21 having respective solder bump pads or landings 29. Optionally, a conventional anisotropic silicon etch may be used prior to depositing and patterning a polymer isolation layer as liner 15.

For purposes of clarity by way of example and not limitation, it shall be assumed that front side TSVs are used, as the following description is generally equally applicable to backside TSVs.

Figure 1C:
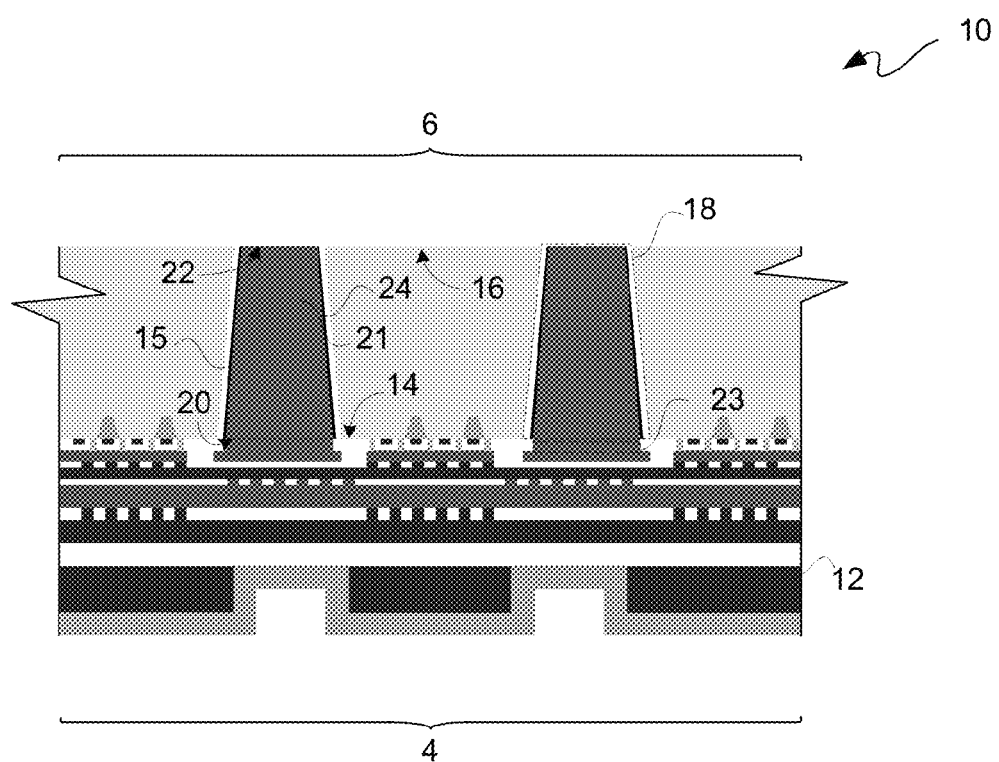
FIG. 1C is the diagram of FIG. 1A with the IC vertically flipped after chemical-mechanical-polishing of a lower surface of a substrate of the IC.

FIG. 1C is the diagram of FIG. 1A with IC 10 after a chemical-mechanical-polishing ("CMP") of a lower surface 16 of a substrate 12. Such CMP may be performed to temporarily reveal lower end contact surface 22, and thus portions of liner 15 and barrier layer 24 previously underlying lower end contact surface 22 may be removed by CMP. Thus, in this example, lower end contact surface 22 may be coplanar and level with lower surface 16.

Figure 1D:
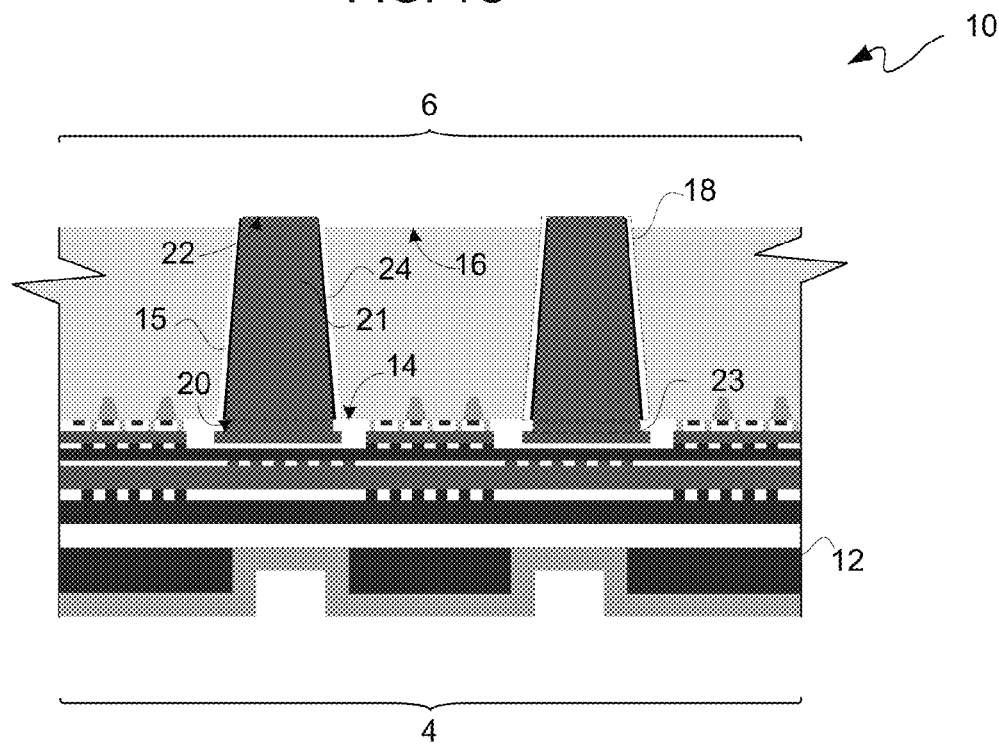
FIG. 1D is the diagram of FIG. 1A with the IC vertically flipped after a backside etch of a lower surface of a substrate of the IC to reveal a lower end contact surface of a via conductor thereof.

FIG. 1D is the diagram of FIG. 1A with IC 10 after a backside etch of a lower surface 16 of substrate 12 to temporarily reveal a lower end contact surface 22 of a via conductor 21. In this example, lower end contact surface 22 may be coplanar with lower surface 16; however, as via conductor 21, and optionally barrier layer 24, may protrude from substrate 12 after a backside reveal etch, lower end contact surface 22 in this example is not level with lower surface 16. For purposes of clarity and not limitation, IC 10 of FIG. 1D shall be further described, as the following description may likewise apply to IC 10 of FIG. 1C.

Figure 1E:
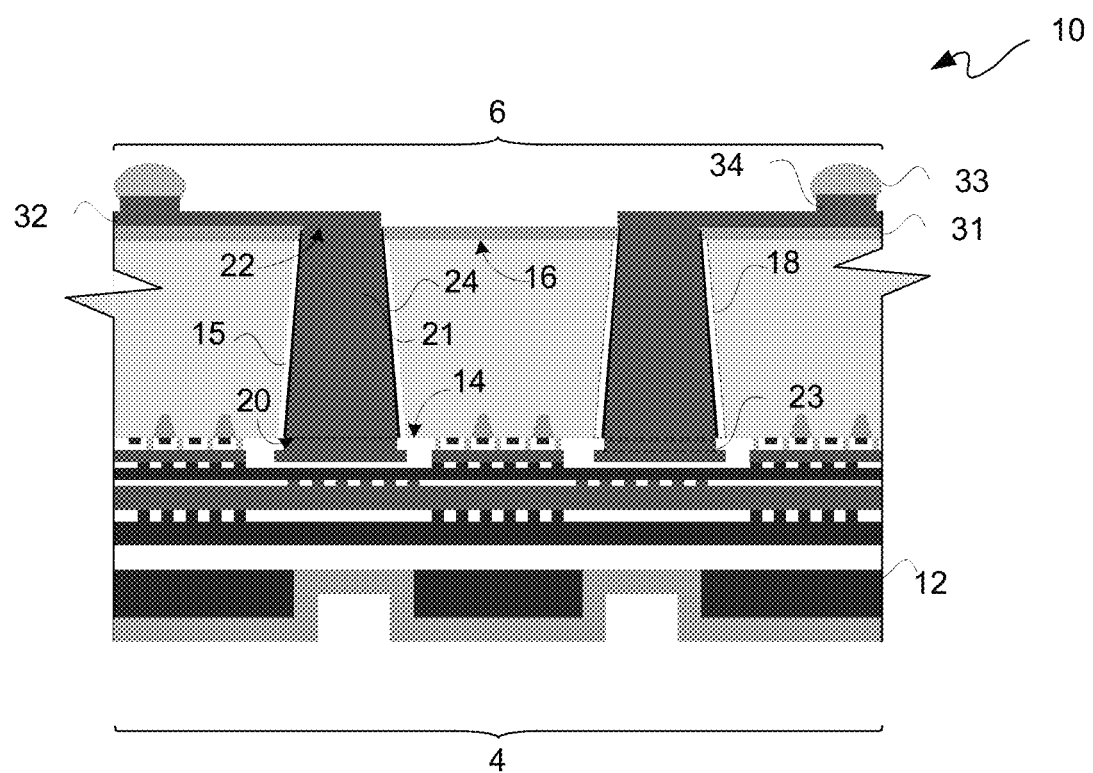
FIG. 1E is the diagram of FIG. 1D with a lower surface of the IC having formed thereon a passivation layer, which may be formed of one or more dielectric layers.

FIG. 1E is the diagram of FIG. 1D with a lower surface 16 of a substrate 12 having formed thereon a passivation layer 31, which may be formed of one or more dielectric layers. Furthermore, passivation layer 31 may be a polymer layer. For example, passivation layer 31 may be a benzocyclobutene ("BCB") layer or a combination of a silicon nitride layer and a BCB layer. In some applications, passivation layer 31 may be referred to as an inter-die layer. A metal layer 32, such as a copper, copper alloy, or other metal previously described, may be formed on passivation layer 31 and on lower end contact surfaces 22 of via conductors 21. This metal layer 32 may be an RDL metal layer. Balls 33 may be respectively formed on bonding pads 34, where such pads may be formed on or as part of metal layer 32. Balls 33 may be formed of a bonding material, such as solder or other bonding material. Balls 33 may be microbumps, C4 bumps, ball grid array ("BGA") balls, or some other die interconnect structure. In some applications, metal layer 32 may be referred to as a landing pad.

More recently, TSVs have been used to provide what is referred to as three-dimensional ("3D") ICs or "3D ICs." Generally, attaching one die to another using, in part, TSVs may be performed at a bond pad level or an on-chip electrical wiring level. ICs 10 may be diced from a wafer into single dies. Such single dies may be bonded to one another or bonded to a circuit platform, as previously described. For purposes of clarity by way of example and not limitation, it shall be assumed that an interposer is used for such circuit platform.

Interconnection components, such as interposers, may be in electronic assemblies for a variety of purposes, including facilitating interconnection between components with different connection configurations or to provide spacing between components in a microelectronic assembly, among others. Interposers may include a semiconductor layer, such as of silicon or the like, in the form of a sheet or layer of material or other substrate having conductive elements such as conductive vias extending within openings which extend through such layer of semiconductor material. Such conductive vias may be used for signal transmission through such interposer. In some interposers, ends of such vias may be used as contact pads for connection of such interposer to other microelectronics components. In other examples, one or more RDLs may be formed as part of such interposer on one or more sides thereof and connected with one or both ends of such vias. An RDL may include numerous conductive traces extending on or within one or more dielectric sheets or layers. Such traces may be provided in one level or in multiple levels throughout a single dielectric layer, separated by portions of dielectric material within such RDL. Vias may be included in an RDL to interconnect traces in different levels of such RDL.

Figure 2A:
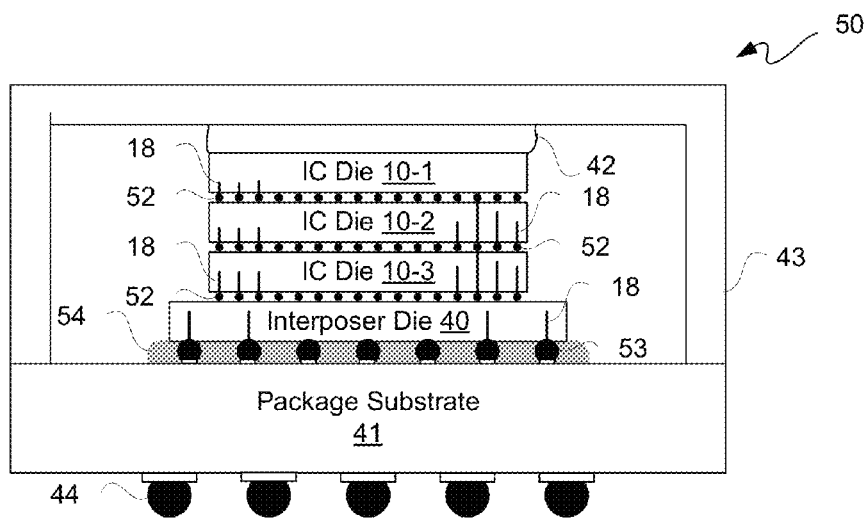
FIG. 2A is a block diagram of a cross-sectional view depicting an exemplary three-dimensional ("3D") IC packaged component with via structures.

FIG. 2A is a block diagram of a cross-sectional view depicting an exemplary 3D IC packaged component 50 with via structures 18. While a stacked die or a package-on-package die may include TSV interconnects, use of via structures 18 for a 3D IC packaged component 50 is described for purposes of clarity by way of example. In this example of a 3D IC packaged component 50, there are three ICs 10, namely ICs 10-1, 10-2, and 10-3, stacked one upon the other. In other implementations, there may be fewer or more than three ICs 10 in a stack. ICs 10 may be bonded to one another using microbumps 52 or flip-chip solder bumps. Optionally, Cu pillars extending from a backside of a die may be used. Some of these microbumps 52 may be interconnected to via structures 18. For example, a Cu/Sn microbump transient liquid phase ("TLP") bonding technology may be used for bonding ICs to one another. Thus, interconnect layers may be on one upper or lower side or both upper and lower sides of an IC 10 of a 3D stack.

A bottom IC 10-3 of such ICs in a 3D stack optionally may be coupled to an interposer 40. Interposer 40 may be an active die or a passive die. For purposes of clarity and not limitation, it shall be assumed that interposer 40 is a passive die. IC 10-3 may be coupled to interposer 40 by microbumps 52. Interposer 40 may be coupled to a package substrate. A package substrate may be formed of thin layers called laminates or laminate substrates. Laminates may be organic or inorganic. Examples of materials for "rigid" package substrates include an epoxy-based laminate such as FR4, a resin-based laminate such as bismaleimide-triazine ("BT"), a ceramic substrate, a glass substrate, or other form of package substrate. An under fill 53 for a flip chip attachment may encapsulate C4 bumps or other solder balls 53 used to couple interposer die 40 and package substrate 41. A spreader/heat sink ("heat sink") 42 may be attached to package substrate 41, and such heat sink 42 and substrate package 41 in combination may encase ICs 10 and interposer 40 of such 3D stack. A thermal paste 42 may couple an upper surface of IC 10-1 on top of such 3D stack to an upper internal surface of such heat sink 42. Ball grid array ("BGA") balls or other array interconnects 44 may be used to couple package substrate 41 to a circuit platform, such as a PCB for example.

Figure 2B:
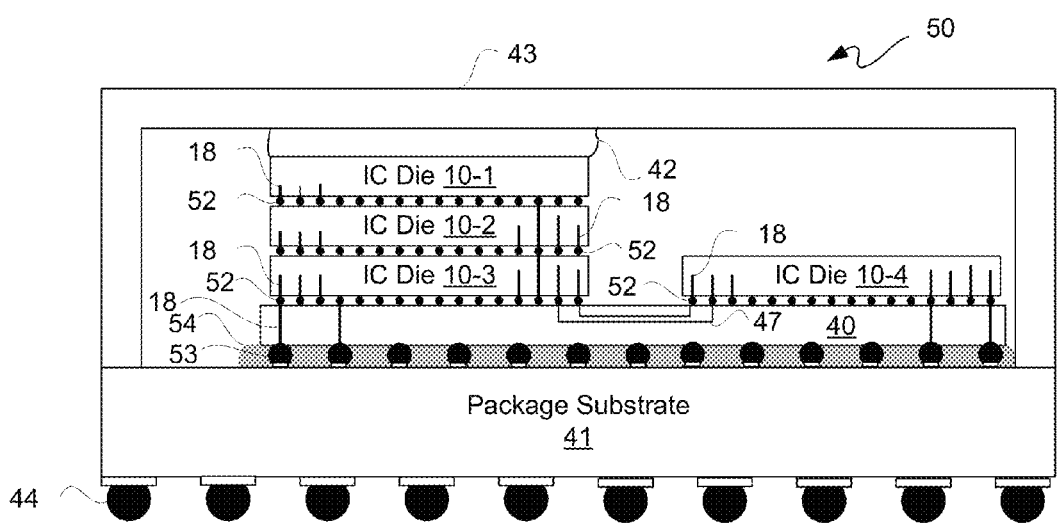
FIG. 2B is a block diagram of a cross-sectional view depicting another exemplary 3D IC packaged component with via structures.

FIG. 2B is a block diagram of a cross-sectional view depicting another exemplary 3D IC packaged component 50 with via structures 18. 3D IC packaged components 50 of FIGS. 2A and 2B are the same except for the following differences; in FIG. 2B, another IC 10-4 is separately coupled via microbumps 52 to interposer 40, where IC 10-4 is not coupled in the stack of ICs 10-1, 10-2, and 10-3. Furthermore, interposer 40 includes metal and via layers for providing wires 47 for interconnecting ICs 10-3 and 10-4. Furthermore, interposer 40 includes via structures 18 coupled to IC 10-4 through microbumps 52.

3D wafer-level packaging ("3D-WLP") may be used for interconnecting two or more ICs, one or more ICs to an interposer, or any combination thereof, where interconnects thereof may use via structures 18. Optionally, ICs may be interconnected die-to-die ("D2D") or chip-to-chip ("C2C"), where interconnects thereof may use via structures 18. Further, optionally, ICs may be interconnected die-to-wafer ("D2W") or chip-to-wafer ("C2W"), where interconnects thereof may use via structures 18. Accordingly, any of a variety of die stacking or chip stacking approaches may be used to provide a 3D stacked IC ("3D-SIC" or "3D-IC").

Figure 3A:
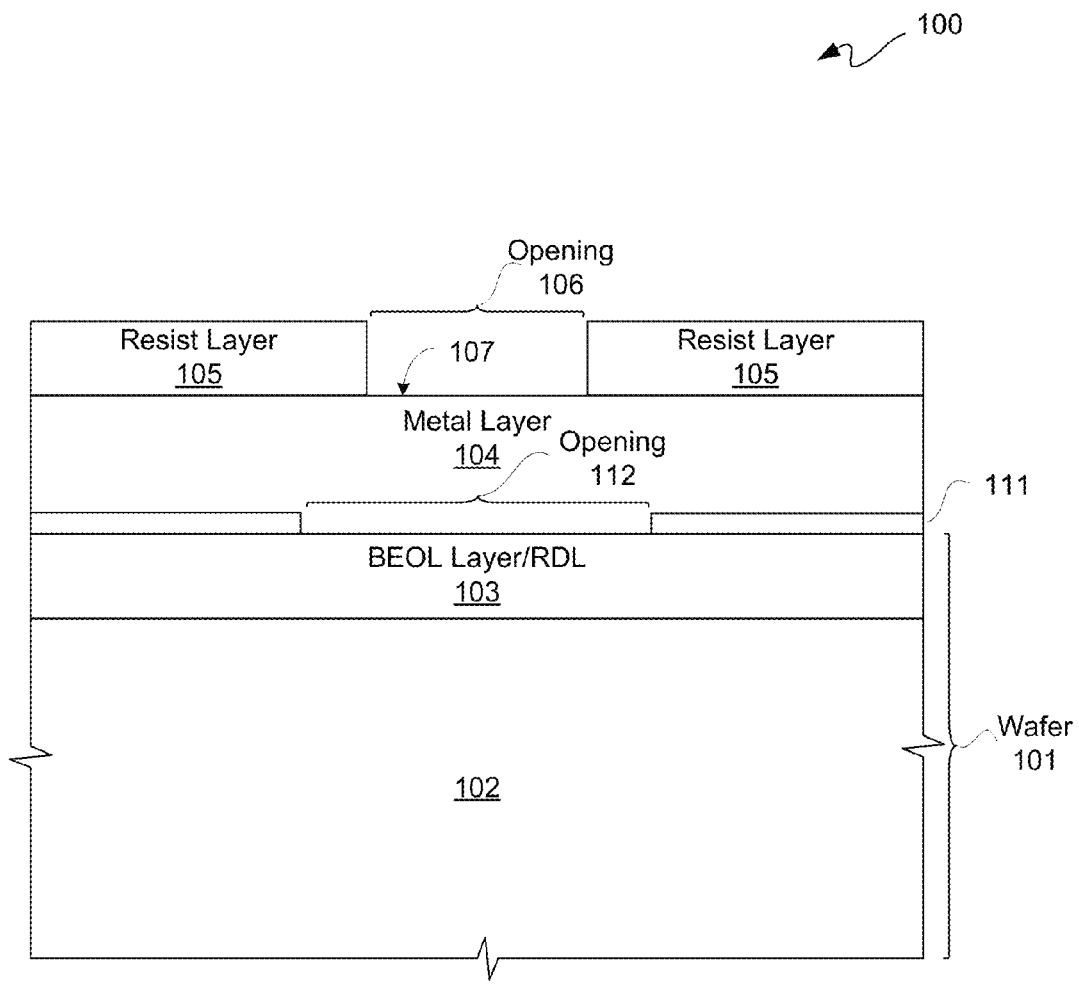
FIG. 3A is a block diagram of a cross-sectional view depicting an exemplary portion of an in-process wafer for providing an IC.

FIG. 3A is a block diagram of a cross-sectional view depicting an exemplary portion of an in-process wafer 101 for providing an IC 100. For purposes of clarity by way of example and not limitation, it shall be assumed that wafer 101 includes a fabricated multi-layered structure ("substrate") 102 with generally any and all BEOL and FEOL processing operations having been completed generally for providing an IC 100. In passive die configurations, such as a passive interposer for example, there may not be any FEOL processing operations. As used above, substrate 12 of FIG. 1A for example was a single layer. However, more generally a substrate may be a single layer or multiple layers used to form a passive or active component. Along those lines, a semiconductor die may be referred to as a substrate.

Again, for purposes of clarity by way of example and not limitation, it shall be assumed that a BEOL layer or an RDL metal layer ("metal layer") 103 has been formed on an upper surface of substrate 102 as part of in-process wafer 101. Additionally, it shall be assumed that an etch stop layer 111, such as may be formed with a dielectric material, may be deposited on an upper surface of metal layer 103. Examples of such an etch stop layer 111 include SiN and $SiO_2$, among others. Etch stop layer 111 may be deposited followed by deposition and patterning of a masking material (collectively a "resist layer") in order to etch openings, including an opening 112, in etch stop layer 111 to temporarily expose upper surface portions of metal layer 103 for subsequent processing.

On such upper surface portions of metal layer 103 and an upper surface of etch stop layer 111 may be deposited metal layer 104. Metal layer 104 may thus be put in contact with such exposed upper surface portions of metal layer 103 through openings, including opening 112. Metal layer 104 may be an interconnect layer, such as for example for interconnection of IC 100 to another die, as previously described. A masking layer, such as resist layer 105, may be formed on an upper surface of metal layer 104 for defining an opening 106 to temporarily expose upper surface portions, including upper surface portion 107, of metal layer 104. Opening 106 may be positioned directly above opening 112 and may generally be centered with respect to opening 112 in order to provide concentric openings. Opening 106 may be narrower than opening 112 in order to provide for sidewalls of a bowl-shaped structure to be formed, as described below in additional detail. However, in other implementations, opening 106 may be wider or may have the same or similar dimensions to opening 112, and in other implementation opening may not be centered with respect to opening 112. This non-centering may be due to lithographic design and/or alignment error in registration between masks. However, opening 106 and 112 will at least be partially be overlaying one another.

Figure 3B:
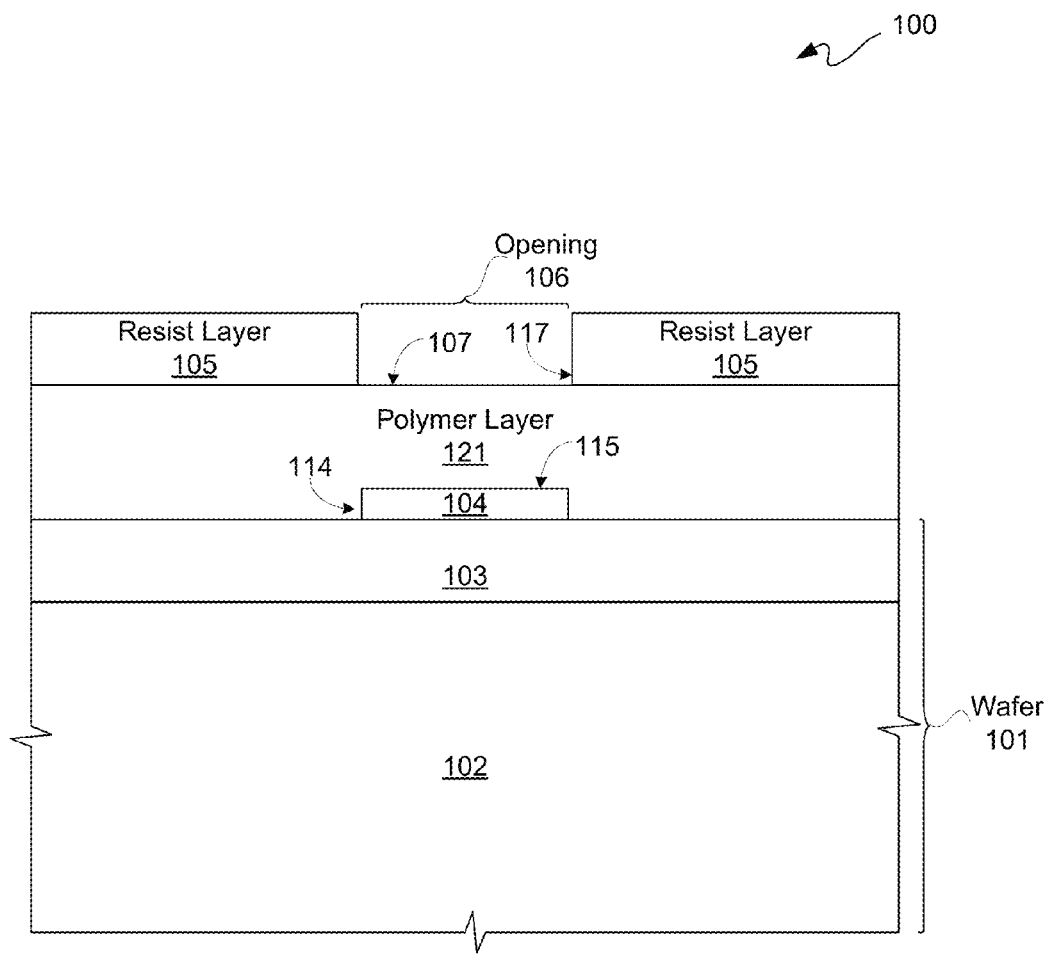
FIG. 3B is a block diagram of a cross-sectional view depicting an exemplary portion of another in-process wafer for providing another IC.

FIG. 3B is a block diagram of a cross-sectional view depicting an exemplary portion of another in-process wafer 101 for providing another IC 100. ICs 100 of FIGS. 3A and 3B are similar, and thus generally only the differences are described below for purposes of clarity and not limitation.

A metal layer 104 may be formed on an upper surface of metal layer 103 in order to provide metal pads for bottoms of bowl-shaped structures, as described below in additional detail. Area of a pad formed with metal layer 104 may at least be approximately the same in area as that of opening 106 and may be generally aligned with opening 106. Optionally, such metal pads may be formed as part of metal layer 103. Metal pads formed with metal layer 104 may be positioned directly below respective openings 106, so as generally to provide openings that are concentrically positioned with respect to metal pads of metal layer 104. On metal layers 103 and 104 may be deposited a polymer layer 121. For example, polymer layer 121 may be spun on or otherwise deposited. A resist layer 105 may be formed on polymer layer 121 for defining opening 106 to temporarily expose upper surface portions, such as upper surface portion 107, of polymer layer 121. Opening 106 may be positioned directly above a metal pad of metal layer 104 and may generally be centered with respect to such pad in order to provide alignment between one or more sidewalls 114 of such metal pad of metal layer 104 and one or more sidewalls 117 of resist layer 105. Optionally, opening 106 may be narrower than width of a metal pad of metal layer 104 such that area of an upper surface 115 of such a metal pad of metal layer 104 is larger than area of opening 106 in order to allow sidewalls of a bowl-shaped structure to be formed, as described below in additional detail, to extend onto upper surface 115 for extra alignment margin. However, in other implementations, opening may be larger or have the same dimensions as such metal pad of metal layer 104. Optionally, a sacrificial etch stop layer (not shown in this figure) may be formed on metal layer 104 to act as a passivation layer to avoid contaminating or oxidizing such an underlying metal layer, such as by formation of polymer layer 121. Such sacrificial etch stop layer may be a silicon oxide or a silicon nitride for example.

Figure 4A:
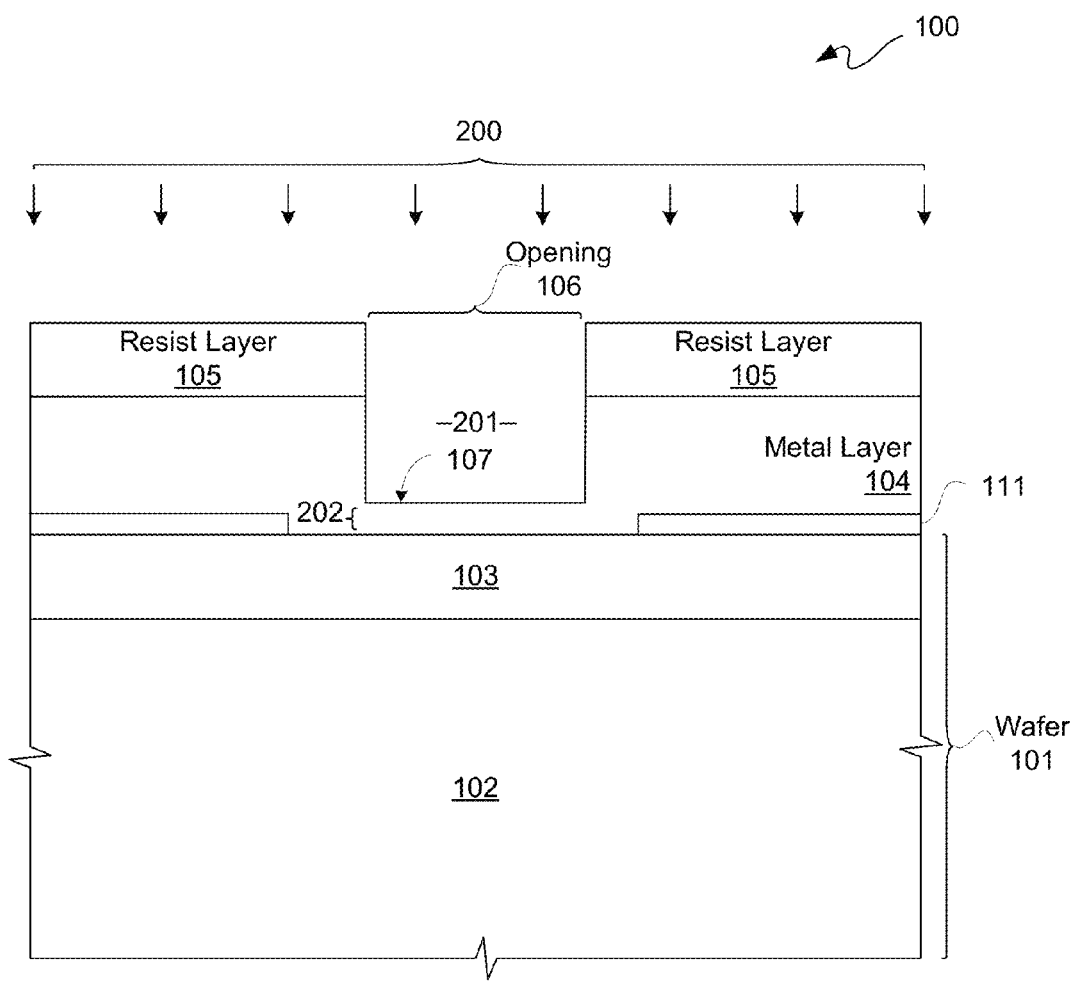
FIG. 4A is a block diagram of a cross-sectional view depicting an exemplary portion of the in-process wafers of FIG. 3A for a configuration after subsequent processing of the IC of FIG. 3A.

FIG. 4A is a block diagram of a cross-sectional view depicting an exemplary portion of the in-process wafer 101 of FIG. 3A for providing an IC 100. After patterning resist layer 105, a metal anisotropic etch 200 may be performed to etch an opening 201 into metal layer 104. However, in other implementations, a metal isotropic etch 200 may be used though this may involve some undercutting of metal layer 104 with respect to resist layer 105 as width of opening 106 may be large in comparison to thickness of resist layer 105 or depth of opening 201. Such opening 201 may not extend all the way through metal layer 104 so as to leave a bottom thickness 202 for providing a bottom of a bowl-shaped structure. Thus, in some implementations, this may be a timed metal etch, where thickness 202 may be approximately 500 Angstroms or less. However, thickness 202 may be approximately 3000 Angstroms or less so to provide a sufficiently low resistance over a width or length of opening 106, so as to avoid having to use a more powerful power supply for plating. Position of an opening 201 may correspond to position of an opening 106. Generally, thickness 202 may be vary from implementation-to-implementation relative to dimensions of opening 106, aspect ratio of opening 201, amount of metal to be deposited in opening 201, and/or thickness of metal layer 104.

Figure 4B:
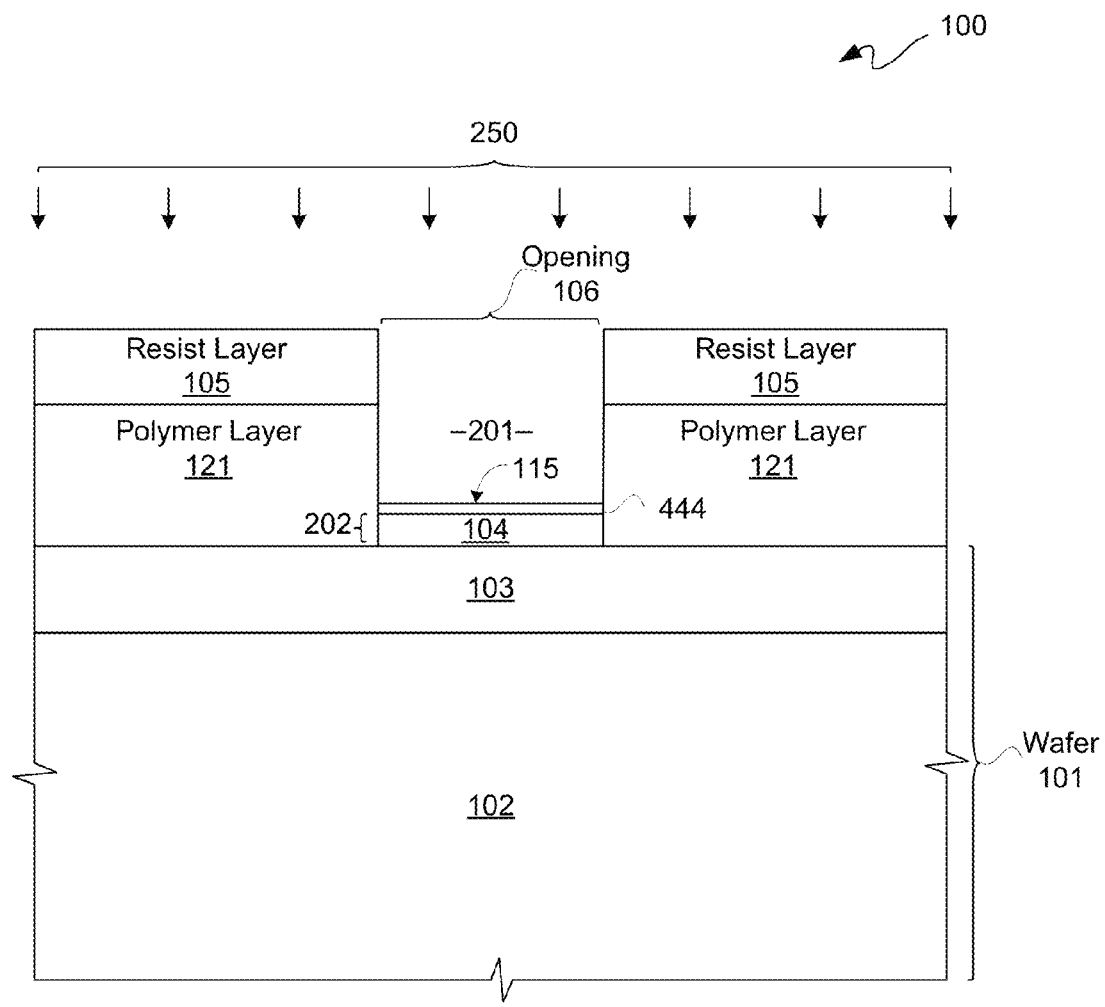
FIG. 4B is a block diagram of a cross-sectional view depicting an exemplary portion of the in-process wafers of FIG. 3B for a configuration after subsequent processing of the IC of FIG. 3B.

FIG. 4B is a block diagram of a cross-sectional view depicting an exemplary portion of the in-process wafer 101 of FIG. 3B for providing an IC 100. After patterning resist layer 105, a polymer anisotropic etch 250 may be performed to etch an opening 201 down to an upper surface 115 of an optional sacrificial etch stop layer 444 formed on metal layer 104 as a passivation layer. In other implementations, a polymer isotropic etch 250 may be used though again this may involve some undercutting of polymer layer 121 with respect to resist layer 105. Such etch 250 may stop on etch stop layer 444. In another implementation, etch stop layer 444 may be omitted and etch 250 may etch down to metal layer 104. For example, though a plasma or dry etch, such as a reactive ion etch ("RIE"), may damage metal layer 104 but for etch stop layer 444, a wet etch may be used which does not damage metal layer 104. Moreover, chemistry may be changed in situ for an RIE for example to remove etch stop layer 444 after having etched metal layer 104 for forming opening 201, and such changed chemistry may stop on metal layer 104. Again, such etch stop layer 444 may be a silicon oxide or a silicon nitride for example. Furthermore, for example, for a wet etch, such as with HF for example, an oxide etch stop layer 444 may be used. Metal layer 104 may provide a bottom thickness 202 for providing a bottom of a bowl-shaped structure. Position of an opening 201 may correspond to position of opening 106.

Figure 4C:
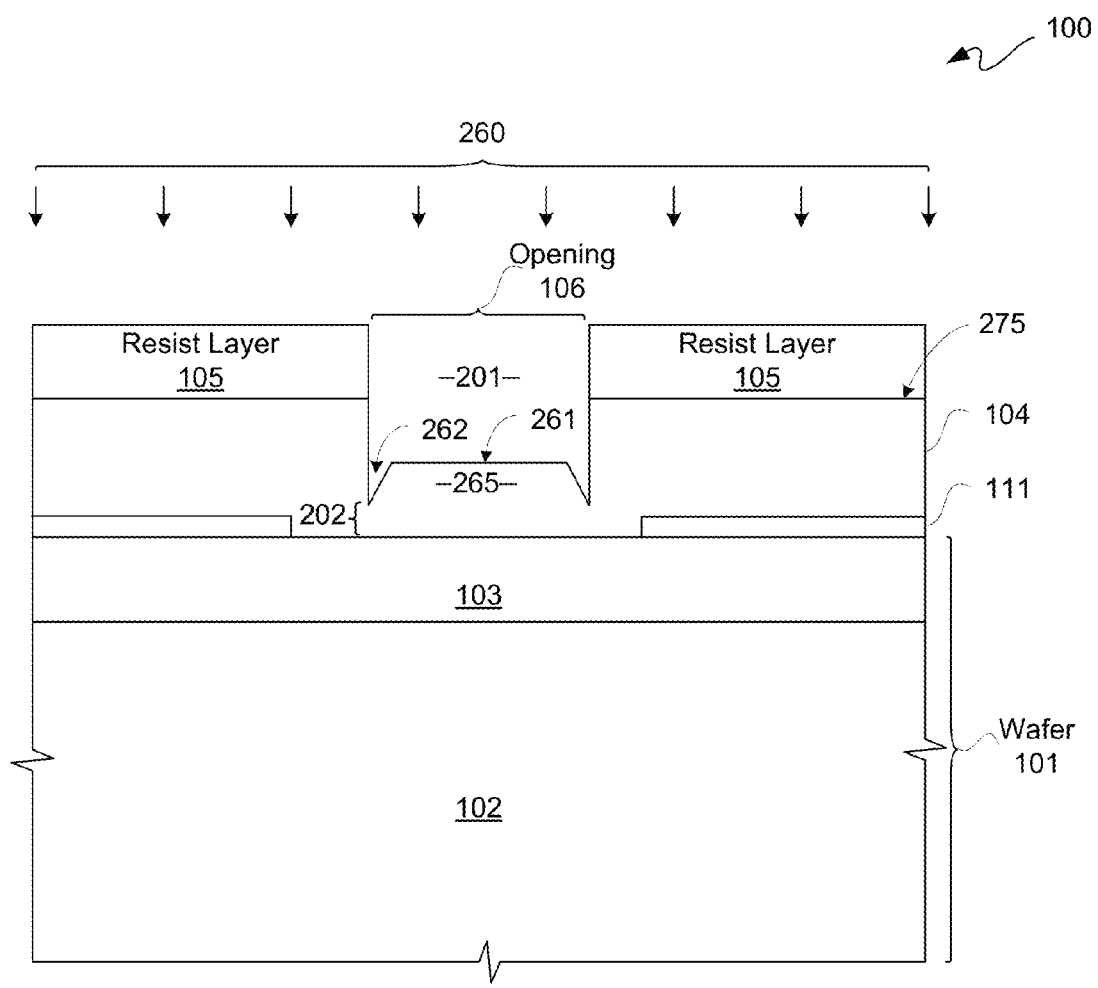
FIG. 4C is a block diagram of a cross-sectional view depicting an exemplary portion of the in-process wafers of FIG. 3A for another configuration after subsequent processing of the IC of FIG. 3A.

FIG. 4C is a block diagram of a cross-sectional view depicting an exemplary portion of the in-process wafer 101 of FIG. 3A for providing an IC 100. After patterning resist layer 105, a wet metal anisotropic etch or electro-sculpting 260 may be performed to etch an opening 201 into metal layer 104 leaving a post or raised middle portion 265 as defined by a recess or "moat" 262 around such post 265 in opening 201 for defining a bottom contour of a lower surface of opening 201. Post 265 may have an upper surface 261 that is below an upper surface 275 of metal layer 104.

Such opening 201 may not extend all the way through metal layer 104 so as to leave a bottom thickness 202 for providing a bottom of a bowl-shaped structure, such as for mechanical continuity for example, as described below in additional detail. Additionally, bottom thickness 202 of metal layer 104 may provide electrical continuity, such as for a seed layer, as shall be further understood from the following description. Etch 260 may be a timed wet metal etch. Additional details for "electro-scuplting" or "electrolytic sculpting" or "electrolytic shaping" using a wet chemistry, which may be used for such wet metal etch, may be found in co-pending U.S. patent application Ser. No. 14/046,443, titled "Method For Preparing Low Cost Substrates," which is incorporated by reference herein in its entirety for all purposes. Such electrolytic sculpting or shaping may be any electrolytic wet chemistry removal of material, where an electric field is shaped to locally enhance removal rate of a wet chemistry. Position of opening 201 may correspond to position of opening 106 for alignment between them. Opening 201 may have a lower surface with a post 265 as delineated by a recess 262 extension of opening 201. Distances between a lower surface of recess 262 and an upper surface of metal layer 103 may be thickness 202.

Figure 4D:
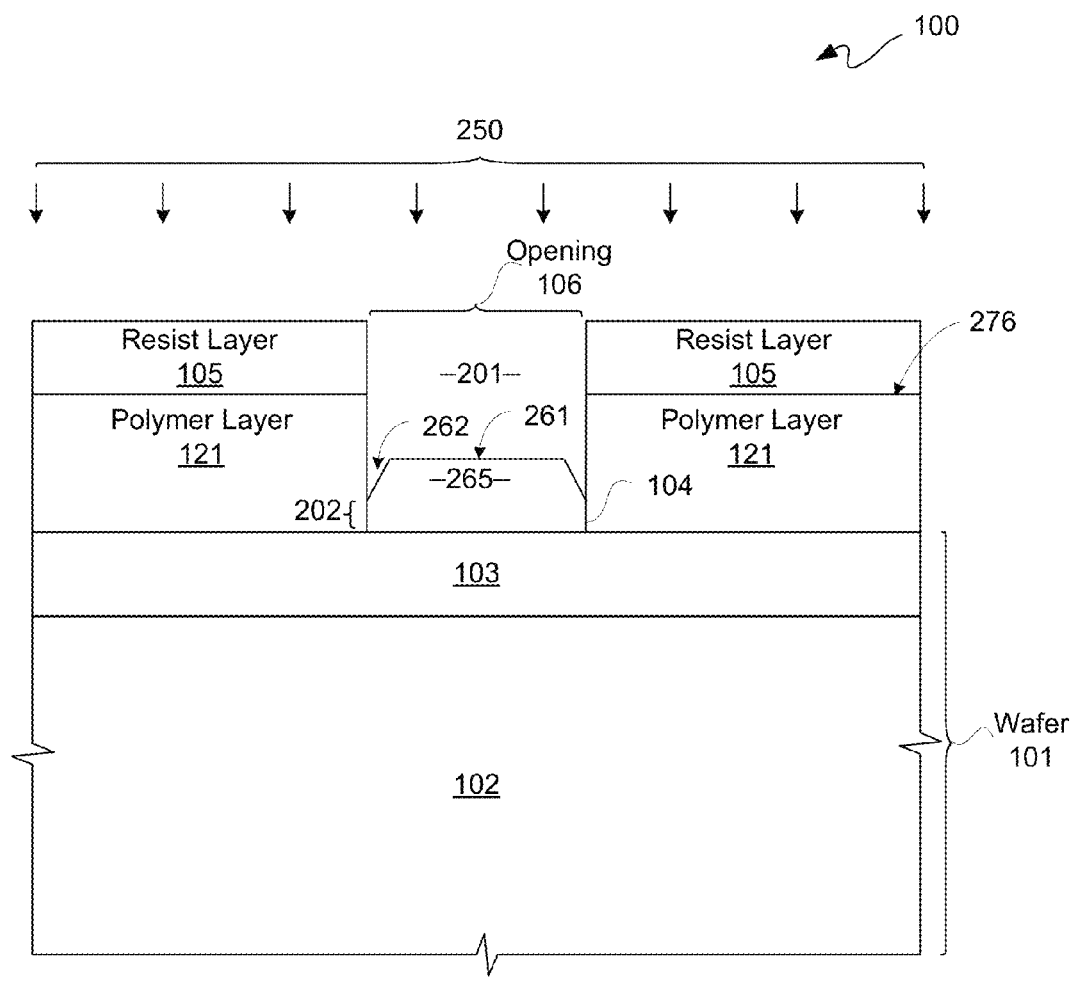
FIG. 4D is a block diagram of a cross-sectional view depicting an exemplary portion of the in-process wafers of FIG. 3B for another configuration after subsequent processing of the IC of FIG. 3B.

FIG. 4D is a block diagram of a cross-sectional view depicting an exemplary portion of the in-process wafer 101 of FIG. 3B for providing an IC 100. After patterning resist layer 105, a polymer etch 250 may be performed to etch an opening 201 down to an upper surface 261 portion of metal layer 104. Such etch 250 may stop on metal layer 104. Metal layer 104 may provide a bottom thickness 202 for providing a bottom of a bowl-shaped structure. Such etch 250 may be changed in-situ for a metal etch 260 to form post 265 and recess 262 as previously described with reference to FIG. 4C. Again, position of opening 201 may correspond to position of opening 106 for alignment between them, and an upper surface 261 of post 265 may be below an upper surface 276 of polymer layer 121.

Figure 4E:
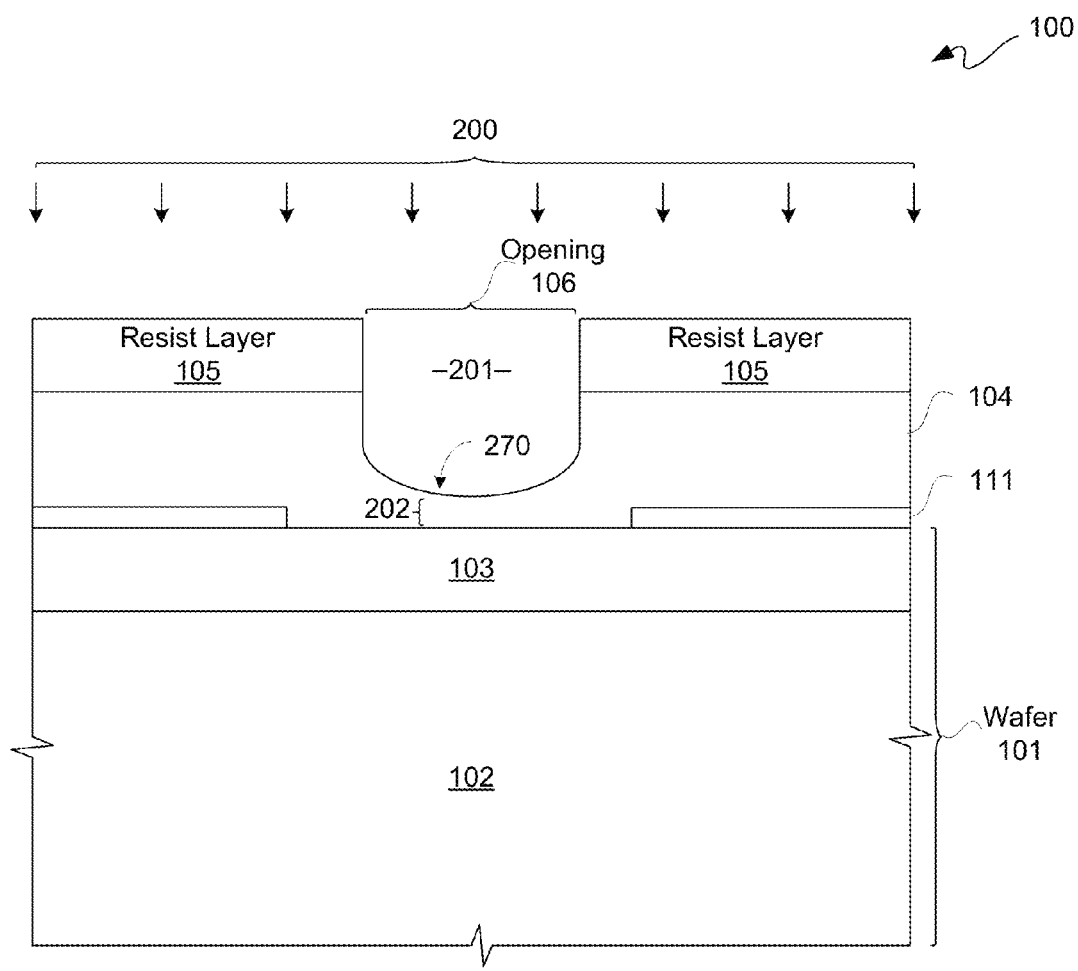
FIG. 4E is a block diagram of a cross-sectional view depicting an exemplary portion of the in-process wafers of FIG. 3A for yet another configuration after subsequent processing of the IC of FIG. 3A.

FIG. 4E is a block diagram of a cross-sectional view depicting an exemplary portion of the in-process wafer 101 of FIG. 3A for providing an IC 100. FIG. 4E is the same as FIG. 4A, except a lower surface 270 of opening 201 is illustratively depicted as having a concave shape or profile. Along those lines, etch 200, 250 or 260 may, though need not, produce a concave lower surface in order to produce a bowl-shaped structure as described herein. As used hereinbelow, the term "bowl-shaped" refers to any hollow having a bottom and a sidewall, regardless of the surface contour of such a bottom or sidewall. However, for purposes of clarity by way of example and not limitation, FIGS. 4A and 4B are used hereinbelow for further description of formation of bowl-shaped structures.

Figure 5A:
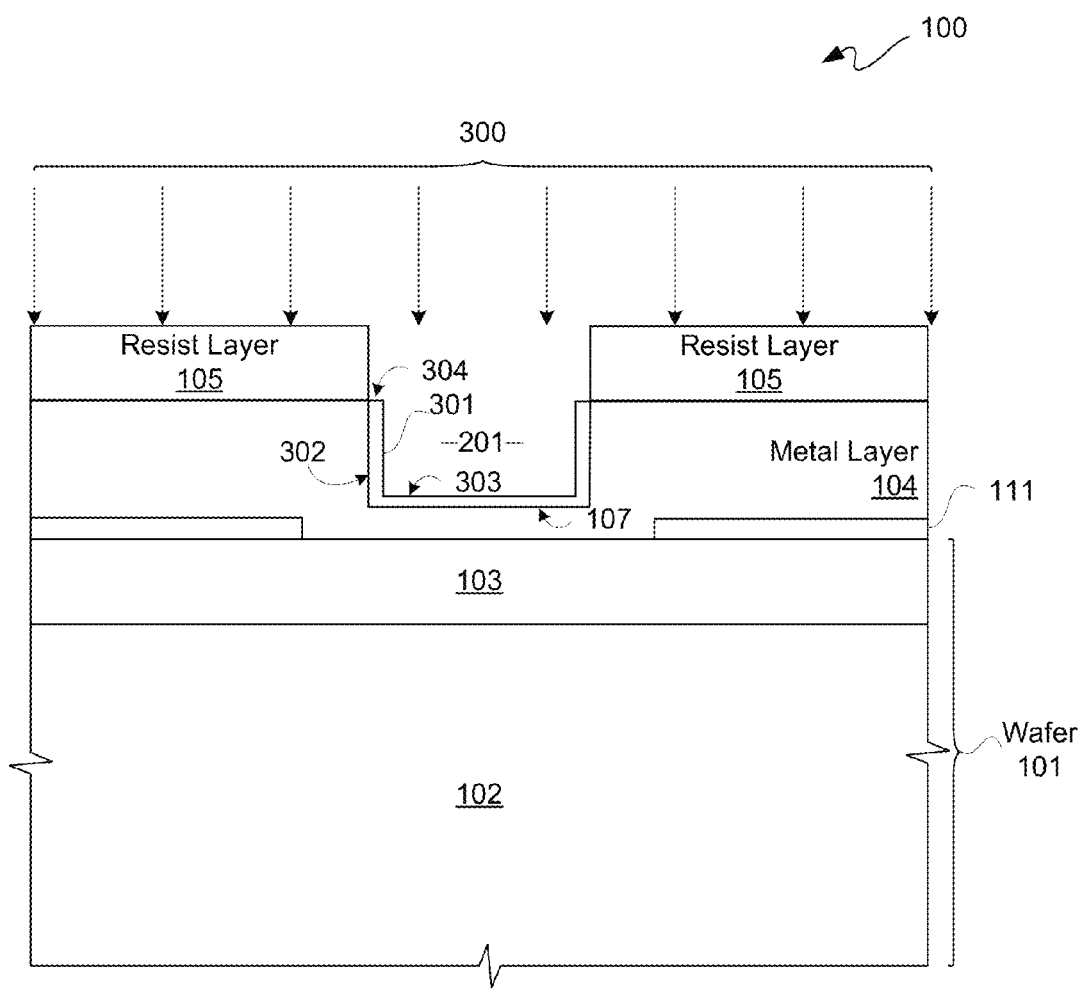
FIG. 5A is a block diagram of a cross-sectional view depicting an exemplary portion of the in-process wafer of FIG. 4A after subsequent processing of the IC of FIG. 4A.

FIG. 5A is a block diagram of a cross-sectional view depicting an exemplary portion of the in-process wafer 101 of FIG. 4A for providing an IC 100. A metal deposition 300 is performed to provide a metal layer 301 in opening 201. Along those lines, such metal deposition 300 may be an electroplating or electrolytic plating of metal layer 104, as metal layer 104 may be continuous for purposes of biasing such metal layer 104 for electroplating. Thus, a conformal, or optionally non-conformal, metal layer 301 may be plated onto a sidewall surface 302 and a lower surface 107 of opening 201 defined in metal layer 104. Optionally, an electroless plating may be used. Metal layer 301 may include an adhesion layer and/or a barrier layer, and metal layer 301 may include more than one type of metal or more generally more than one type of conductor. For example, for a Cu metal layer 104, metal layer 301 may contain Pd, or any alloy material. Other materials that may be used for metal layer 301 include without limitation nickel, nickel-tungsten, or nickel-phosphorus, among other metals or metal compounds or alloys. Along those lines, it should be understood that electroless nickel plating ("EN") for example is an auto-catalytic deposition. Accordingly, metal layer 301 may have an upper surface 304, an exterior sidewall surface 302 and an interior sidewall surface 301, as well as an exterior lower surface 107 and an interior lower surface 303, where interior and exterior are with reference to metal layer 301.

Figure 5B:
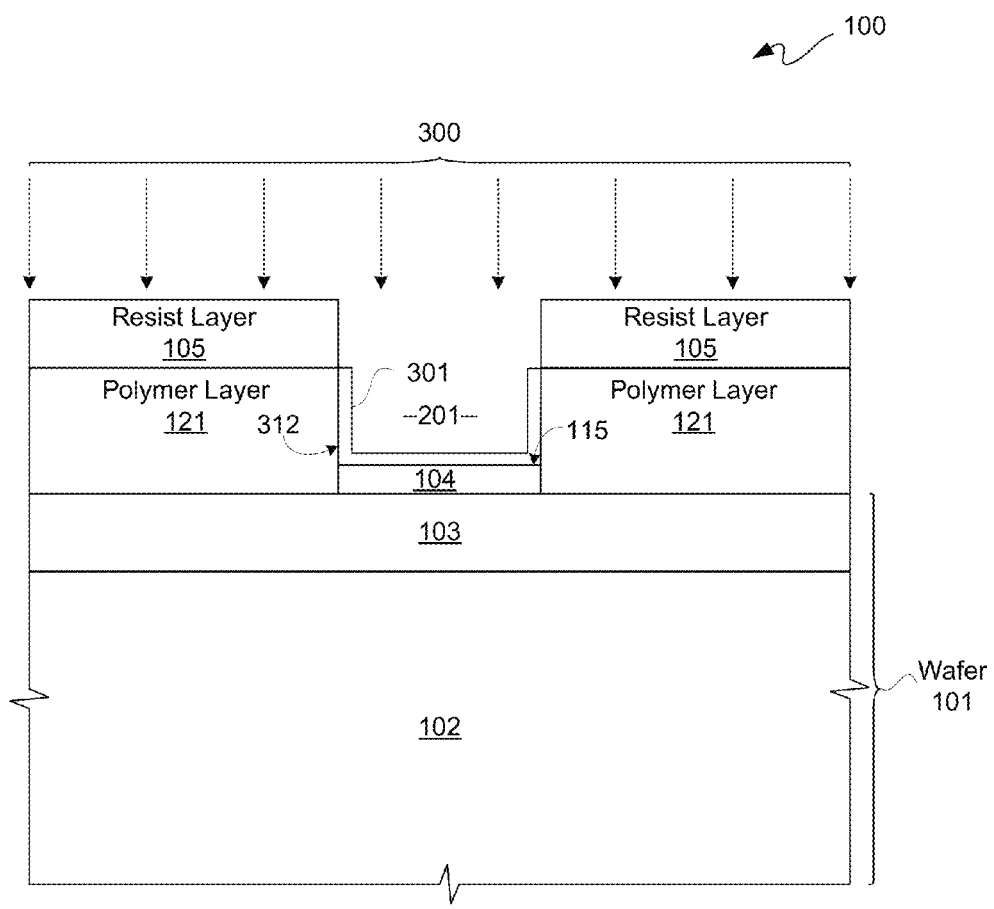
FIG. 5B is a block diagram of a cross-sectional view depicting an exemplary portion of the in-process wafer of FIG. 4B after subsequent processing of the IC of FIG. 4B.

FIG. 5B is a block diagram of a cross-sectional view depicting an exemplary portion of the in-process wafer 101 of FIG. 4B for providing an IC 100. A metal deposition 300 is performed to provide a metal layer 301 in opening 201. Along those lines, such metal deposition 300 may be an electroless plating onto an upper surface of metal layer 104 and a sidewall surface of polymer 121, for example using an auto-catalytic reaction. Thus, a conformal or non-conformal metal layer 301 may be plated onto a sidewall surface 312 of polymer layer 121 and an upper surface 115 of metal layer 104, where surfaces 312 and 115 are both surfaces of opening 201. Again, metal layer 301 may be an adhesion layer and/or barrier layer. For example, for a Cu metal layer 104 and a polymer layer 121, a nickel-phosphorous or a nickel-boron with a reducing agent may be used for such electroless plating for metal deposition 300. Other materials that may be used for an electroless plating of an adhesion/barrier layer include without limitation palladium, nickel, nickel-cobalt, or nickel-tungsten, among others. Once a seed layer is formed in opening 201, another conductive material, such as solder for example, may be electrolyticly or electrolessly deposited into opening 201. Moreover, once a seed layer is established such as by electrolessly plating, such chemistry may be switched in situ for electrolyticly plating.

Figure 6A:
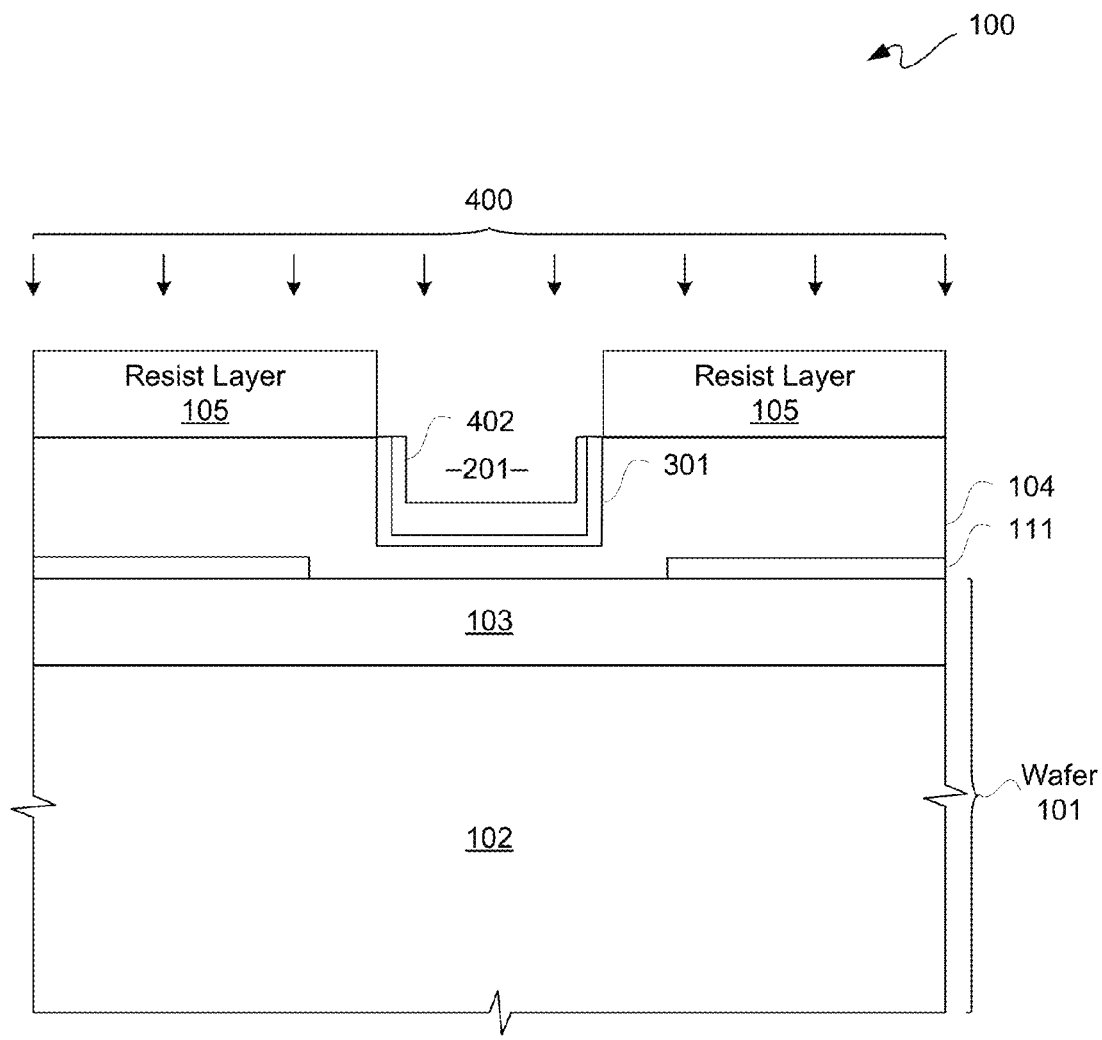
FIG. 6A is a block diagram of a cross-sectional view depicting an exemplary portion of the in-process wafer of FIG. 5A after subsequent processing of the IC of FIG. 5A.
Figure 6B:
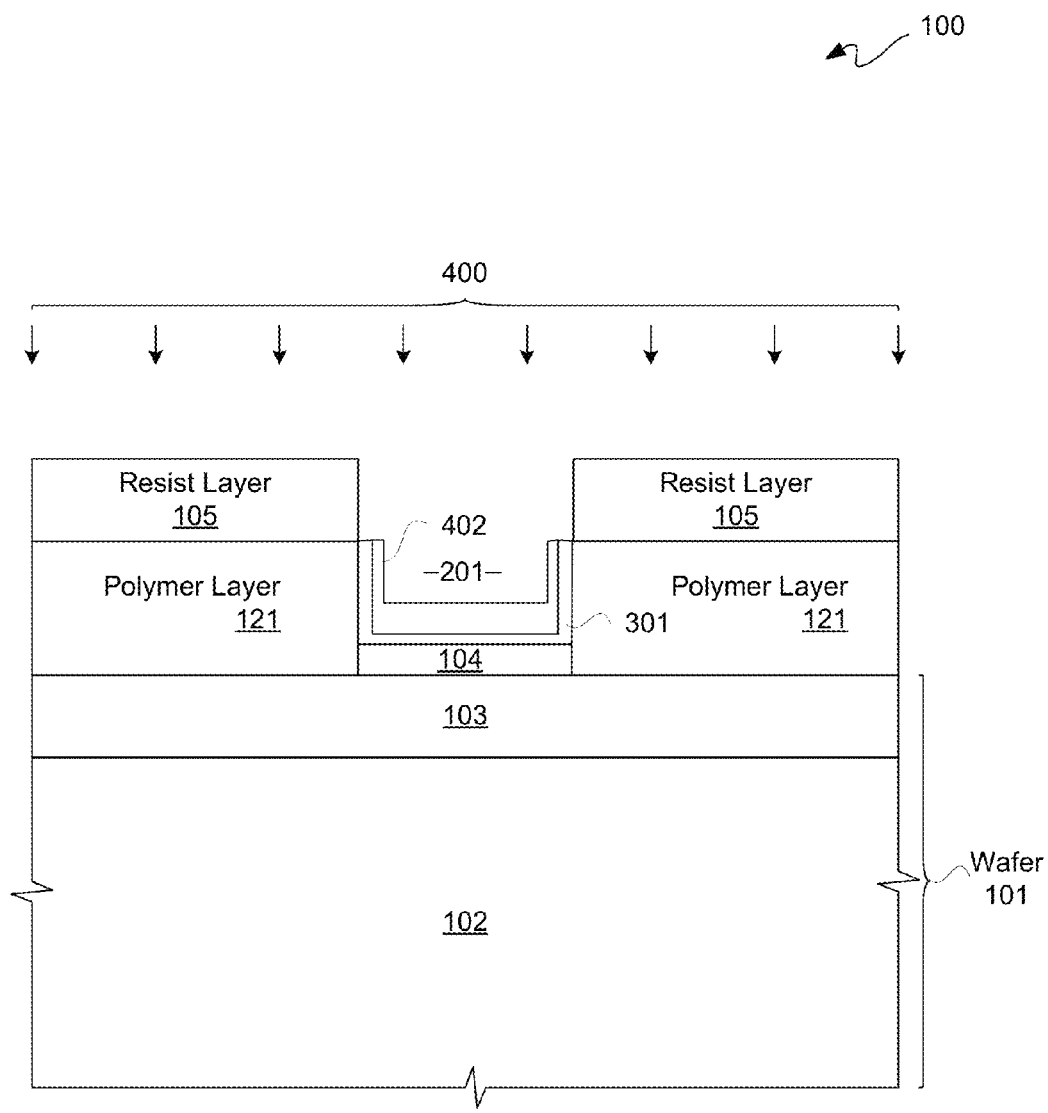
FIG. 6B is a block diagram of a cross-sectional view depicting an exemplary portion of the in-process wafer of FIG. 5B after subsequent processing of the IC of FIG. 5B.

FIG. 6A is a block diagram of a cross-sectional view depicting an exemplary portion of the in-process wafer 101 of FIG. 5A for providing an IC 100. FIG. 6B is a block diagram of a cross-sectional view depicting an exemplary portion of the in-process wafer 101 of FIG. 5B for providing an IC 100. As FIGS. 6A and 6B are substantially similar, they are simultaneously described below.

A metal deposition 400 is performed to provide a metal layer 402 in opening 201. Metal layer 402 may be a contact layer. Along those lines, such metal deposition 400 may be an immersion bath plating, or a combination of electroplating and immersion bath plating, to form a metal layer 402 onto metal layer 301. Thus, a metal layer 402 may be deposited to partially fill a remainder of opening 201. Such metal layer 402 may be plated or coated onto an interior sidewall surface, as well as an interior lower surface of metal layer 301 in opening 201. For example, for a palladium metal layer 301, gold may be used for metal layer 402. In some implementations, metal layer 402 may include more than one conductive material. One or more conductive metals of metal layer 402 may be coated sequentially from metal coating operations. In other implementations, metal layer 402 may be an alloy. In some instances, composition of metal layer 402 may vary within the thickness of metal layer 402. Other materials that may be used for a metal layer 402 include without limitation palladium, tin, tin-copper, tin-solder alloy, among others. Additionally, there may be a coating of metal layer 402 on an upper surface of metal layer 301 in other embodiments, though not illustratively depicted.

Figure 7A:
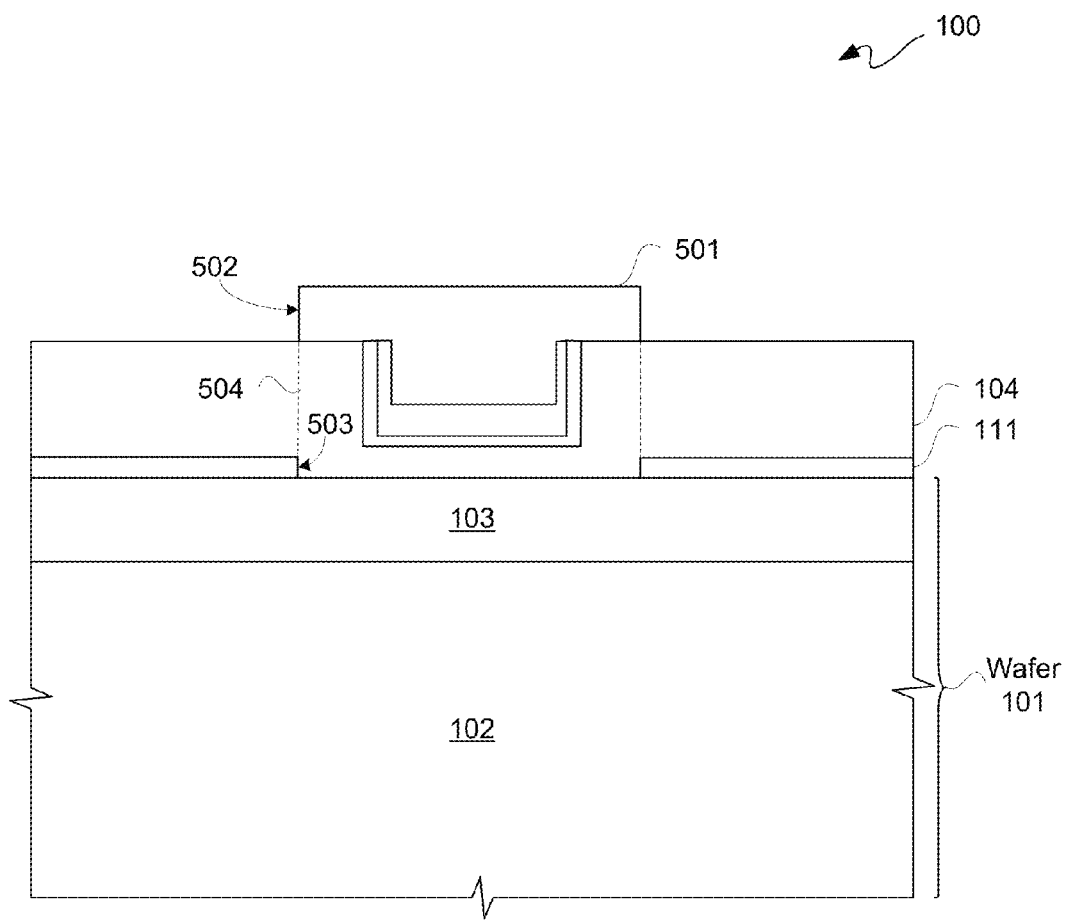
FIG. 7A is a block diagram of a cross-sectional view depicting an exemplary portion of the in-process wafer of FIG. 6A after subsequent processing of the IC of FIG. 6A.

FIG. 7A is a block diagram of a cross-sectional view depicting an exemplary portion of the in-process wafer 101 of FIG. 6A for providing an IC 100. With simultaneous reference to FIGS. 3A, 5A, 6A, and 7A, FIG. 7A is further described. A masking layer, such as resist layer 501, is deposited and patterned to protect metal layers 301 and 402, as well as a portion of metal layer 104 between an exterior sidewall surface 302 of metal layer 301 and a sidewall 503 of opening 112 as associated with etch stop layer 111. A portion of metal layer 104 surrounding opening 201 is protected by resist layer 501, where such resist layer 501 may protect a plurality of such portions of metal layer 104 respectively associated with a plurality of openings 201. As generally indicated by dashed lines 504, an exterior sidewall 502 of resist layer 501 may be generally aligned with sidewall 503. Optionally, to allow for some misalignment margin, an exterior sidewall 502 may be aligned to overlap etch stop layer 111. In general terms, resist layer 501 may provide a plurality of plugs for corresponding openings 201, as well as extend outward beyond corresponding openings 112 so as to provide sidewalls for bowl-shaped structures to be provided.

Figure 7B:
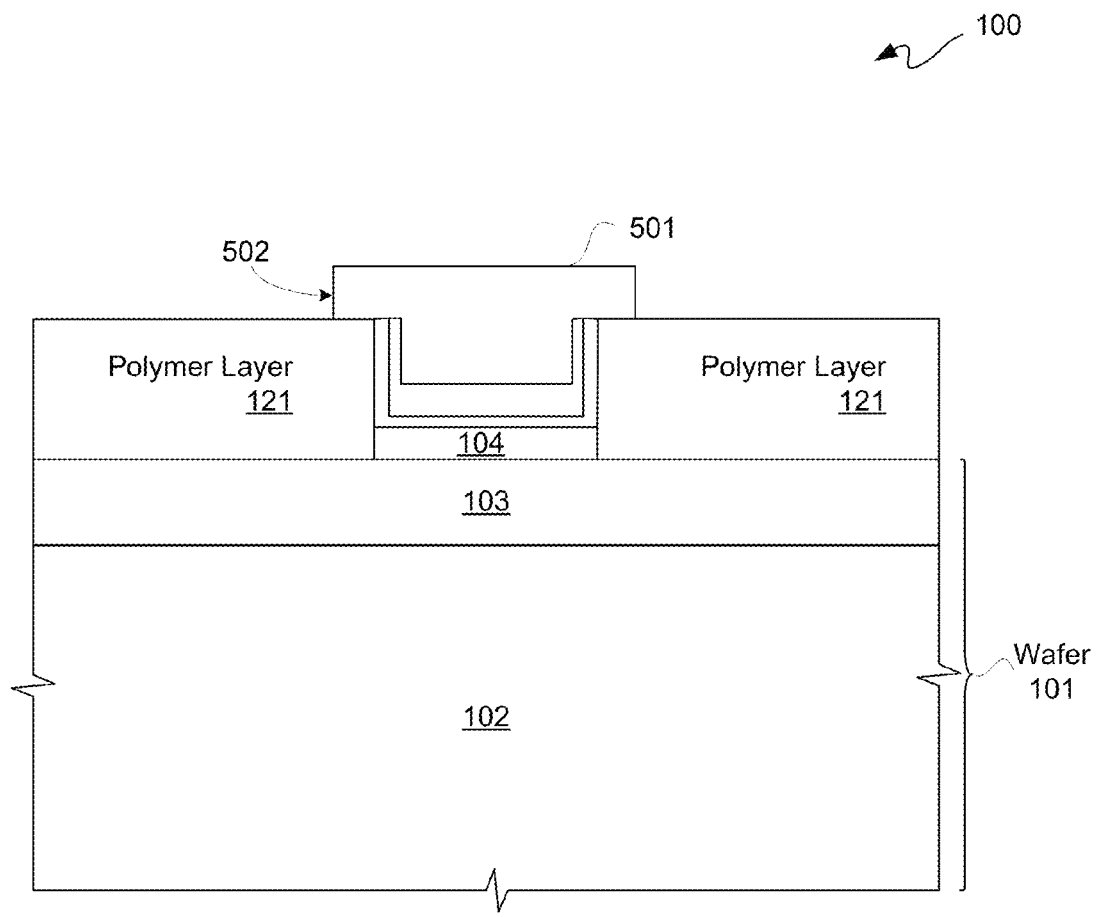
FIG. 7B is a block diagram of a cross-sectional view depicting an exemplary portion of the in-process wafer of FIG. 6B after subsequent processing of the IC of FIG. 6B.

FIG. 7B is a block diagram of a cross-sectional view depicting an exemplary portion of the in-process wafer 101 of FIG. 6B for providing an IC 100. With simultaneous reference to FIGS. 3A, 5A, 6A, 7A, and 7B, FIG. 7B is further described. FIG. 7B is substantially similar to FIG. 7A, except that resist layer 501 is deposited and patterned to protect layers 301 and 402, as well as a portion of polymer layer 121 between an exterior sidewall surface 302 of metal layer 301 to an exterior sidewall 502 of resist layer 501. This spacing may be sufficient for forming a sidewall of a bowl-shaped solder structure.

Figure 8A:
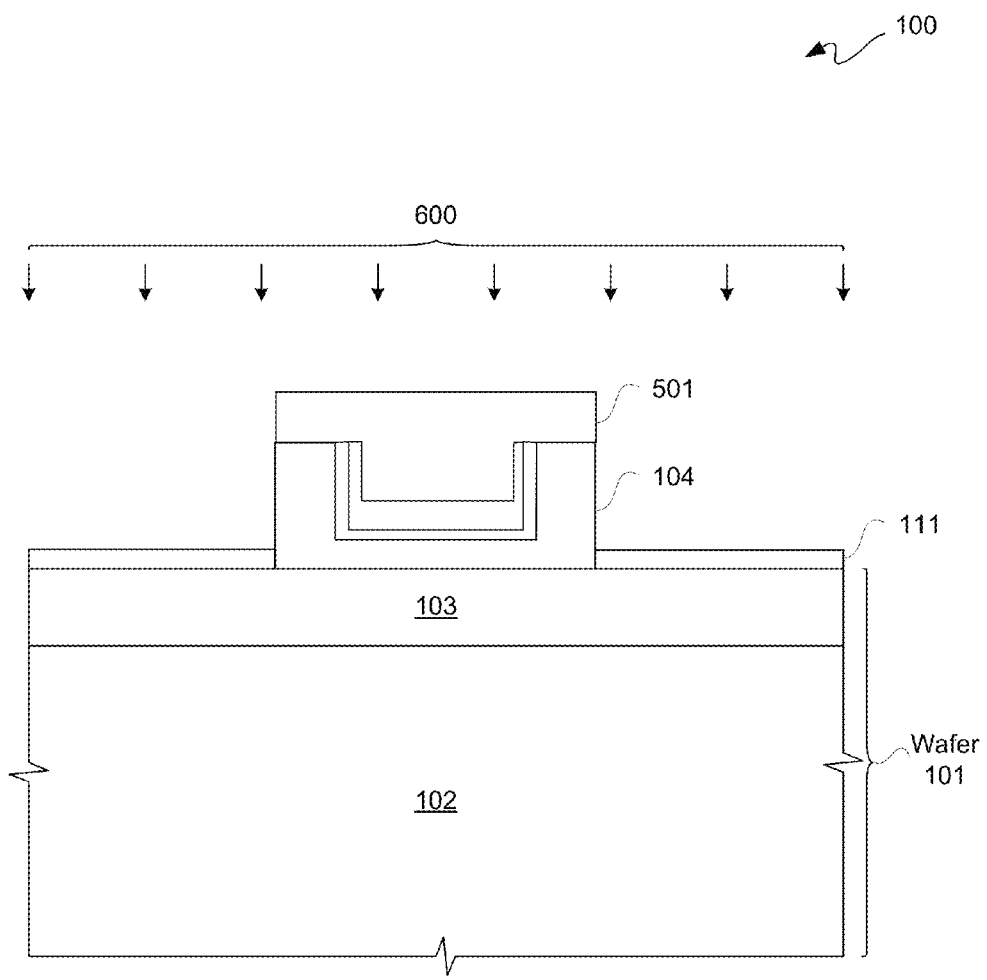
FIG. 8A is a block diagram of a cross-sectional view depicting an exemplary portion of the in-process wafer of FIG. 7A after subsequent processing of the IC of FIG. 7A.

FIG. 8A is a block diagram of a cross-sectional view depicting an exemplary portion of the in-process wafer 101 of FIG. 7A for providing an IC 100. An anisotropic metal etch 600 may be used to remove an exposed portion of metal layer 104 not protected by resist layer 501 down to etch stop layer 111. Optionally, metal etch 600 may be an isotropic etch.

Figure 8B:
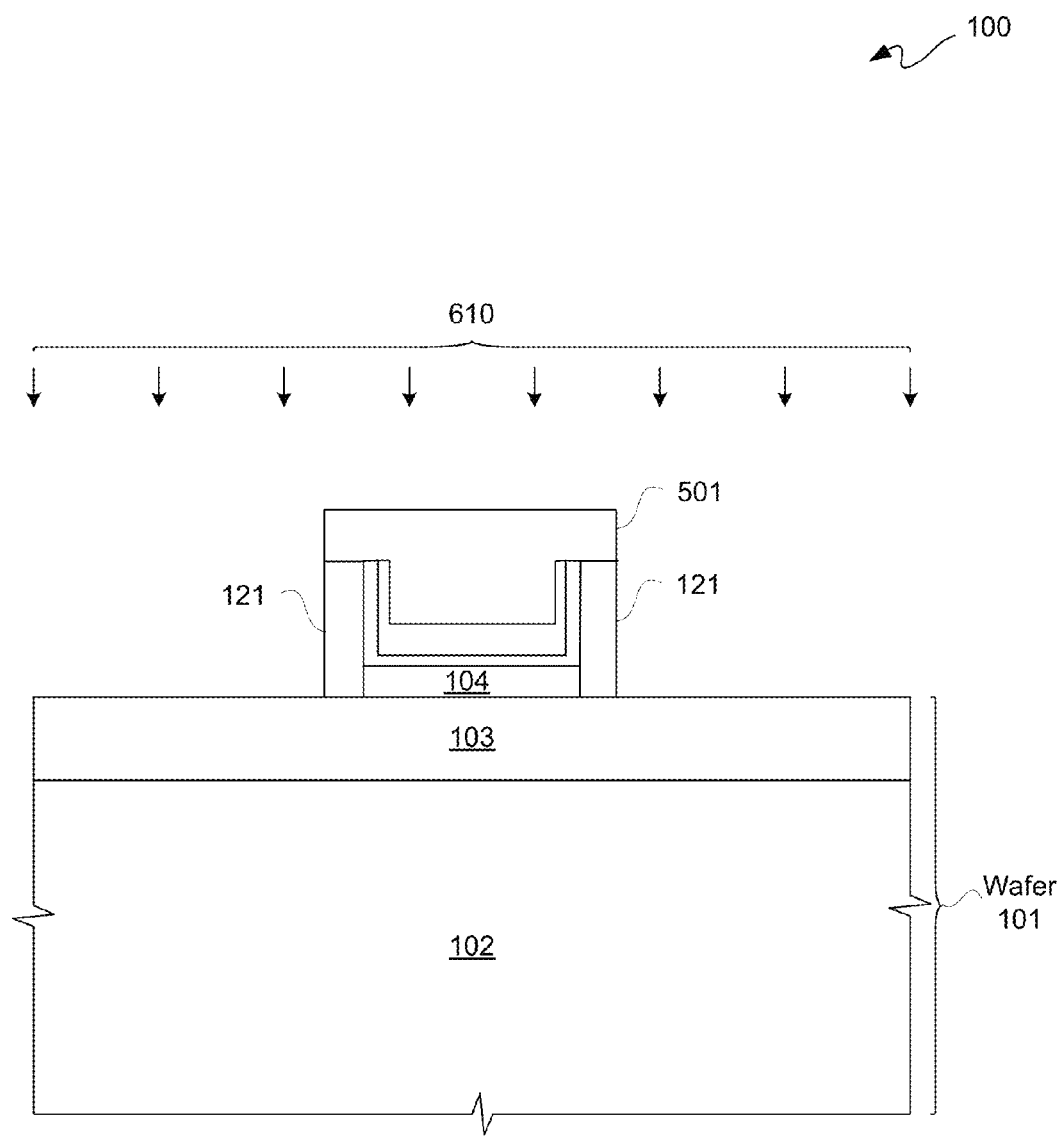
FIG. 8B is a block diagram of a cross-sectional view depicting an exemplary portion of the in-process wafer of FIG. 7B after subsequent processing of the IC of FIG. 7B.

FIG. 8B is a block diagram of a cross-sectional view depicting an exemplary portion of the in-process wafer 101 of FIG. 7B for providing an IC 100. An anisotropic polymer etch 610 may be used to remove an exposed portion of polymer layer 121 not protected by resist layer 501 down to metal layer 103, namely a stop on metal etch. Again, optionally, a passivation layer (not shown in this figure) may be formed on metal layer 103, which may be used as an etch stop layer. Thus, etch 610 may optionally be changed in situ to remove such sacrificial etch stop layer after removal of an unprotected portion of polymer layer 121.

Figure 9A:
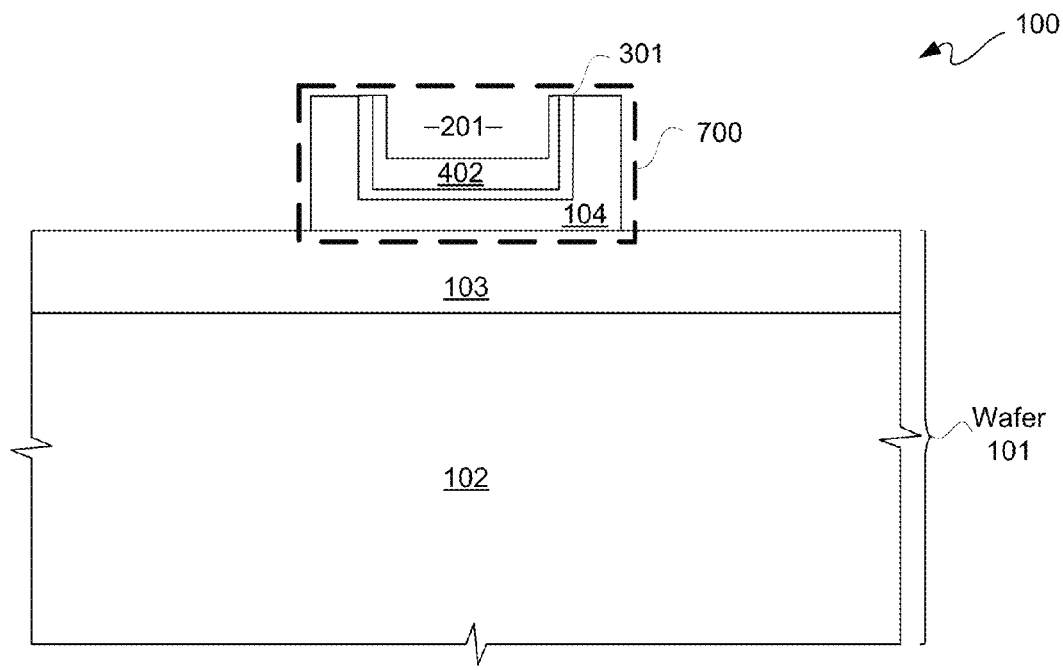
FIG. 9A is a block diagram of a cross-sectional view depicting an exemplary portion of the in-process wafer of FIG. 8A after subsequent processing of the IC of FIG. 8A.

FIG. 9A is a block diagram of a cross-sectional view depicting an exemplary portion of the in-process wafer 101 of FIG. 8A for providing an IC 100. Wafer 101 of FIG. 9A is wafer 101 of FIG. 8A after removal of etch stop layer 111 and resist layer 501. Optionally, etch stop layer 111 need not be removed, but may remain as part of IC 100 along with a bowl-shaped structure 700. Accordingly, metal layer 104 may be formed to provide a plurality of bowl-shaped structures, such as as a bowl-shaped structure 700 having layers 301 and 402 in an opening 201.

Figure 9B:
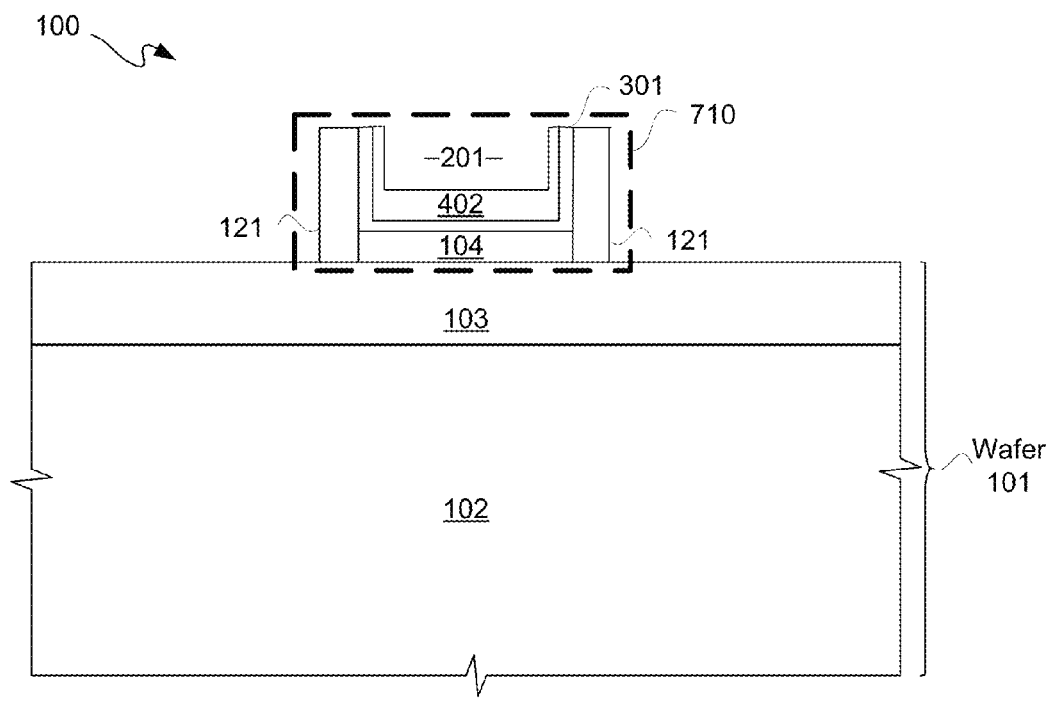
FIG. 9B is a block diagram of a cross-sectional view depicting an exemplary portion of the in-process wafer of FIG. 7B after subsequent processing of the IC of FIG. 7B.

FIG. 9B is a block diagram of a cross-sectional view depicting an exemplary portion of the in-process wafer 101 of FIG. 8B for providing an IC 100. Wafer 101 of FIG. 9B is wafer 101 of FIG. 8B after removal of resist layer 501. A bowl-shaped structure 710 may remain as part of die 100. Accordingly, a metal layer 104 may be formed to provide a plurality of bottoms of an associated plurality of bowl-shaped structures, such as a bottom of bowl-shaped structure 710. Polymer layer 121 may provide a plurality of sidewalls of such plurality of bowl-shaped structures, such as a sidewall of bowl-shaped structure 710. Such bowl-shaped structure 710 may have layers 301 and 402 in a opening 201. Because sidewalls of a bowl-shaped structure 710 may be made of polymer layer 121, outer surfaces of such sidewalls are non-wettable. In other words, exterior sidewall surfaces and upper surfaces of bowl-shaped structures 710 provided by polymer layer 121 are non-wettable with respect to solder. Interior surfaces of polymer layer 121 may provide interior sidewalls which are coated for adhesion of a metal, as previously described.

Figure 10:
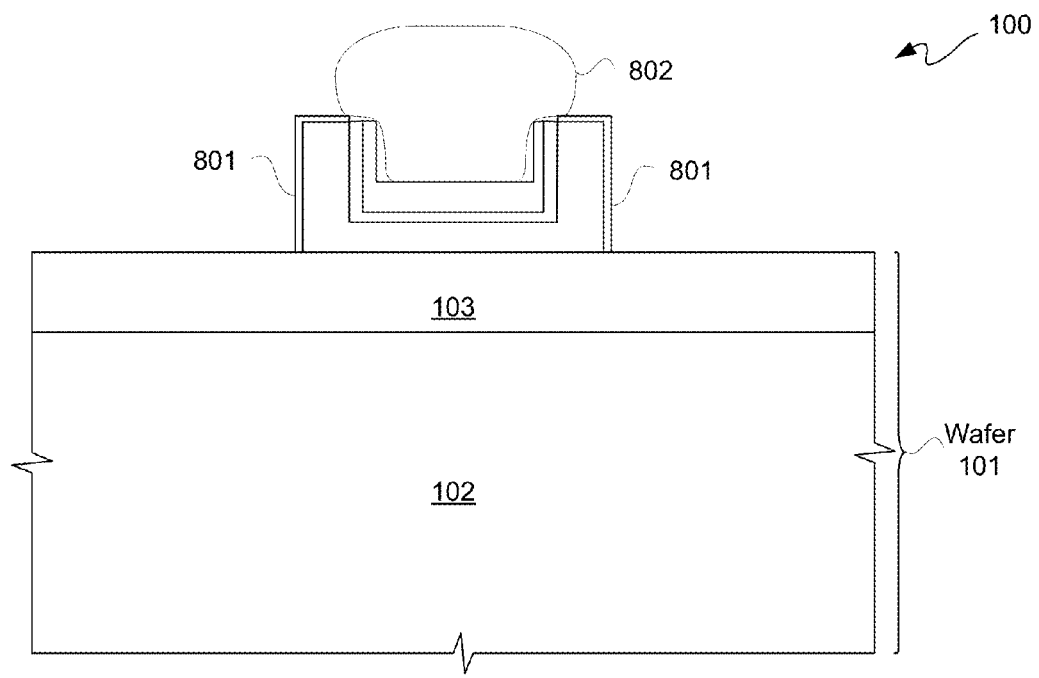
FIG. 10 is a block diagram of a cross-sectional view depicting an exemplary portion of the in-process wafer of FIG. 9A after subsequent processing of the IC of FIG. 9A.

FIG. 10 is a block diagram of a cross-sectional view depicting an exemplary portion of the in-process wafer 101 of FIG. 9A for providing an IC 100. FIG. 10 is further described with simultaneous reference to FIG. 9A.

Wafer 101 of FIG. 10 is wafer 101 of FIG. 9A after removal of etch stop layer 111 and resist layer 501. A bowl-shaped structure 700 may remain as part of IC 100. Accordingly, metal layer 104 may be formed as a bowl-shaped structure 700 having metal layers 301 and 402 in an opening 201.

For metal layer 104 being copper, a passivation layer 801 may optionally be formed on exterior upper surface and sidewall surfaces of bowl-shaped structure 700. For example, such passivation layer 801 may be a complex formed between benzotriazole ("BTA") and such copper. While exposing copper to BTA is known for purposes of creating an anti-corrosion coating, passivation layer 801 in this example is to provide a non-wettable outer surface of bowl-shaped structure 700 with respect to solder. Furthermore, BTA does not wet to gold.

A remainder of opening 201 is for receiving a bonding material. Opening 201 defines a bowl-shaped structure configured to receive and at least partially retain such a bonding material during a reflow process. For example, a solder ball 802 may be deposited into such remainder of opening 201 for interconnection of IC 100 to another die or other circuitry platform, such as previously described. Along those lines, a bowl-shaped structure as described here may be used with a via structure 18 as described herein. Such remainder of opening 201 may, though need not be, completely filled by such solder ball 802. Such solder ball 802 may be a microbump, a C4 bump, a BGA ball, or other form of solder ball, as previously described herein. Likewise, a solder ball 802 may be dropped into a remainder of opening 201 of bowl-shaped structure 710 of FIG. 9B.

Figure 11:
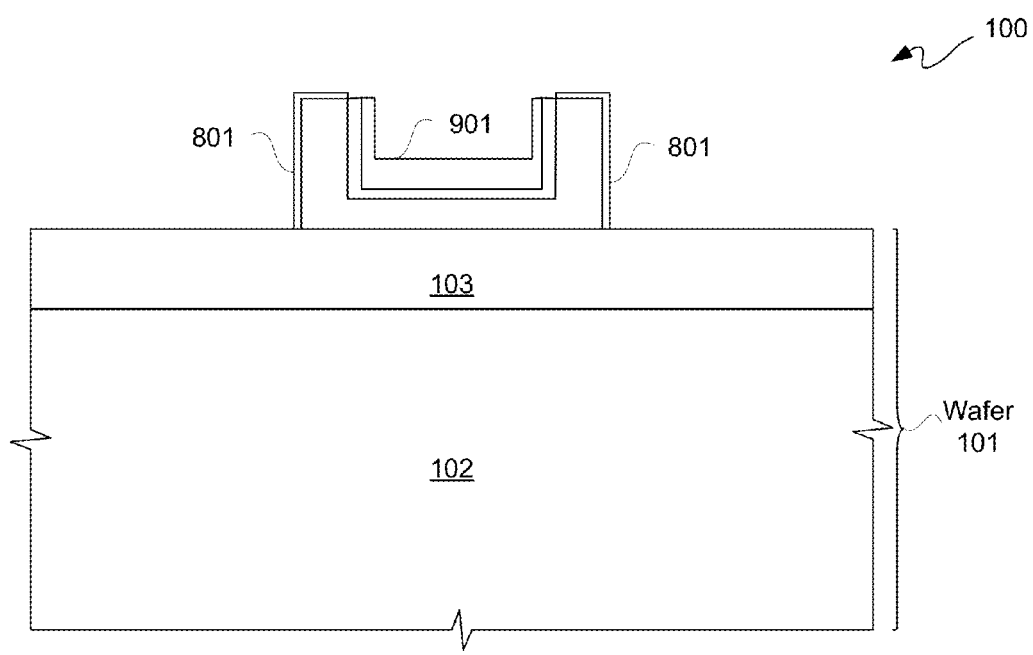
FIG. 11 is a block diagram of a cross-sectional view depicting an exemplary portion of the in-process wafer of FIG. 10 after subsequent processing of the IC of FIG. 10.

FIG. 11 is a block diagram of a cross-sectional view depicting an exemplary portion of the in-process wafer 101 of FIG. 10 for providing an IC 100. Wafer 101 of FIG. 11 is wafer 101 of FIG. 10 after formation of passivation layer 801. A bonding material 901, such as solder for example, may be deposited into a remainder of opening 201 instead of or in addition to gold to further completely or partially fill hollow 201.

Figure 12:
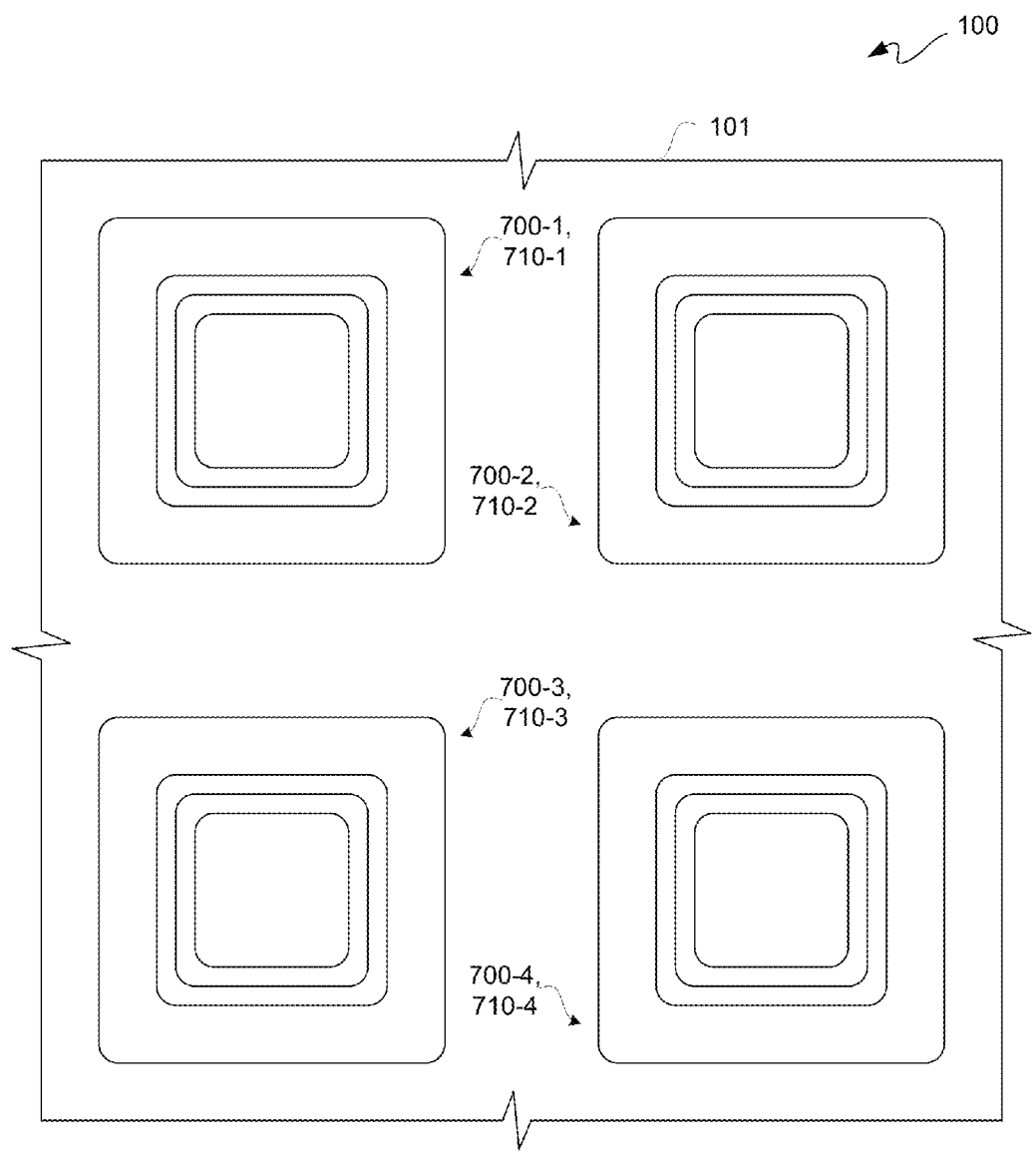
FIG. 12 is a block diagram of a top elevation view depicting an exemplary portion of the in-process wafer of FIGS. 9A or 9B having a plurality of bowl-shaped structures.

FIG. 12 is a block diagram of a top elevation view depicting an exemplary portion of the in-process wafer 101 of FIGS. 9A or 9B having a plurality of bowl-shaped structures 700-1 through 700-4 or 710-1 through 710-4, respectively. Thus, for example, metal layer 104, or a combination of metal layer 104 and polymer layer 121, may provide a plurality of bowl-shaped structures 700 or 710, respectively, for an area array package, such as for example a flip-chip ball grid array package or other area array package. Again, wafer 101 may be for one or more dies of a system-in-a-package ("SiP") or an interposer, namely generally for one or more dies used for or in D2D, W2D, or WLP interconnections for forming a 3D IC using IC 100.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method, comprising:
   obtaining a substrate having a first metal layer and a second metal layer;
   wherein the second metal layer is disposed on the first metal layer;
   forming a first mask on an upper surface of the second metal layer;
   etching an opening in the second metal layer responsive to an opening in the first mask;
   first plating of a lower surface and a sidewall surface in the opening in the second metal layer with a first metal;
   second plating a second metal on the first metal;
   removing the first mask;
   forming a second mask in the opening and on a portion of the upper surface of the second metal layer surrounding the opening; and
   etching the second metal layer responsive to an opening in the second mask down to an etch stop layer to provide a bowl-shaped structure.

2. The method according to claim 1, further comprising etching the stop layer down to the first metal layer.

3. The method according to claim 1, wherein the first metal layer is a redistribution metal layer.

4. The method according to claim 1, wherein:
   the first plating includes electroplating; and
   the second plating includes immersion plating.

5. The method according to claim 1, further comprising exposing the bowl-shaped structure to benzotriazole to form a passivation layer to provide a solder non-wetting exterior sidewall surface of the bowl-shaped structure.

6. A method, comprising:
   obtaining a substrate;
   forming a first metal layer on the substrate, the first metal layer having an opening, the opening of the first metal layer having a bottom and one or more sides extending from the bottom;
   forming a second metal layer on the first metal layer;
   the first metal layer and the second metal layer providing a bowl-shaped structure, an inner surface of the bowl-shaped structure defined responsive to the opening of the first metal layer and the second metal layer thereon;
   the opening of the bowl-shaped structure being configured to receive and at least partially retain bonding material during reflow processing; and
   the bottom of the bowl-shaped structure having a contour including a recess and a post, the post being a portion of the first metal layer defined by the recess around the post.

7. The method according to claim 6, wherein an exterior sidewall surface of the bowl-shaped structure is a non-wetting surface.

8. The method according to claim 7, further comprising forming a passivation layer on the exterior sidewall surface of the bowl-shaped structure to provide the non-wetting surface.

9. The method according to claim 8, wherein:
   the exterior sidewall surface includes a portion opposite the inner surface of the bowl-shaped structure defined responsive to the opening; and
   the exterior side wall surface is included in the one or more sides of the first metal layer on the substrate extending from the bottom.

10. The method according to claim 7, wherein:
    the bonding material is solder; and
    the non-wetting surface is a solder non-wetting surface.

11. The method according to claim 6, wherein the forming of the first metal layer and the second metal layer provide a plurality of bowl-shaped structures including the bowl-shaped structure to provide an area array package.

12. The method according to claim 6, wherein:
    the substrate includes a redistribution metal layer; and
    the first metal layer is in contact with the redistribution metal layer.

13. The method according to claim 6, wherein the first metal layer is a redistribution metal layer.

14. A method, comprising:
    obtaining a substrate;
    forming a first metal layer and a polymer layer on the substrate;
    forming a second metal layer on the first metal layer and extending along a portion of the polymer layer disposed above the first metal layer;
    the first metal layer, the second metal layer and the polymer layer in combination providing a bowl-shaped structure, the second metal layer providing an inner surface of the bowl-shaped structure, the polymer layer providing one or more sides of the bowl-shaped structure with the one or more sides extending from the substrate, the first metal layer disposed between the substrate and the polymer layer providing a bottom of the bowl-shaped structure on which the second metal layer is plated, the portion of the polymer layer having the second metal layer extending along thereof being included in the one or more sides of the bowl-shaped structure;
    the bowl-shaped structure defining an opening; and
    the opening of the bowl-shaped structure being configured to receive and at least partially retain bonding material during reflow processing;
    wherein a lower portion of the inner surface of the bowl-shaped structure has a contour including a recess and a post.

15. The method according to claim 14, wherein an exterior sidewall surface of the bowl-shaped structure is a non-wetting surface.

16. The method according to claim 15, wherein the forming of the first metal layer, the second metal layer and the polymer layer in combination provide a plurality of bowl-shaped structures including the bowl-shaped structure to provide an area array package.

17. The method according to claim 16, wherein:
    the bonding material is solder; and
    the non-wetting surface is a solder non-wetting surface.

18. The method according to claim 14, wherein the recess is disposed around the post.

19. The method according to claim 14, wherein:
    the substrate includes a redistribution metal layer; and
    the first metal layer is in contact with the redistribution metal layer.

* * * * *